US011049550B1

(12) United States Patent
Chang et al.

(10) Patent No.: US 11,049,550 B1
(45) Date of Patent: Jun. 29, 2021

(54) MULTI-BIT CURRENT SENSE AMPLIFIER WITH PIPELINE CURRENT SAMPLING OF RESISTIVE MEMORY ARRAY STRUCTURE AND SENSING METHOD THEREOF

(71) Applicant: NATIONAL TSING HUA UNIVERSITY, Hsinchu (TW)

(72) Inventors: Tung-Cheng Chang, Miaoli County (TW); Chun-Ying Lee, New Taipei (TW); Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/904,577

(22) Filed: Jun. 18, 2020

(51) Int. Cl.
| | |
|---|---|
| G11C 13/02 | (2006.01) |
| G11C 7/06 | (2006.01) |
| G11C 7/02 | (2006.01) |
| G11C 11/4091 | (2006.01) |
| G11C 11/4094 | (2006.01) |
| G11C 5/02 | (2006.01) |
| G11C 11/4074 | (2006.01) |
| G11C 11/4076 | (2006.01) |
| G11C 11/4096 | (2006.01) |
| G11C 13/00 | (2006.01) |
| G11C 16/26 | (2006.01) |
| G11C 7/12 | (2006.01) |
| G11C 11/16 | (2006.01) |
| G11C 11/56 | (2006.01) |

(52) U.S. Cl.
CPC .......... *G11C 11/4091* (2013.01); *G11C 5/025* (2013.01); *G11C 11/4074* (2013.01); *G11C 11/4076* (2013.01); *G11C 11/4094* (2013.01); *G11C 11/4096* (2013.01); *G11C 7/02* (2013.01); *G11C 7/12* (2013.01); *G11C 11/1673* (2013.01); *G11C 11/5642* (2013.01); *G11C 11/5678* (2013.01); *G11C 13/0002* (2013.01); *G11C 13/004* (2013.01); *G11C 16/26* (2013.01)

(58) Field of Classification Search
CPC . G11C 11/4091; G11C 5/025; G11C 11/4074; G11C 11/4076; G11C 11/4094; G11C 11/4096
USPC .................................................. 365/222, 148
See application file for complete search history.

(56) References Cited

U.S. PATENT DOCUMENTS

| 9,431,070 B1 * | 8/2016 | Chang ................. G11C 11/1673 |
| 10,192,611 B1 * | 1/2019 | Yang ................... G11C 11/4087 |
| 2006/0017598 A1 * | 1/2006 | Hales ................... H03F 3/45188 341/155 |

(Continued)

*Primary Examiner* — Ly D Pham
(74) *Attorney, Agent, or Firm* — CKC & Partners Co., LLC

(57) ABSTRACT

A multi-bit current sense amplifier with pipeline current sampling of a resistive memory is configured to sense a plurality of bit line currents of a plurality of bit lines in a pipeline operation. A core sense circuit is connected to one part of the bit lines and generates a reference parallel resistance current and a reference anti-parallel resistance current. A plurality of bit line precharge branch circuits are connected to the core sense circuit and another part of the bit lines. The bit line currents of the bit lines, the reference parallel resistance current and the reference anti-parallel resistance current are sensed by the core sense circuit and the bit line precharge branch circuits in the pipeline operation so as to sequentially generate a plurality of voltage levels on the core sense circuit in a clock cycle.

20 Claims, 15 Drawing Sheets

(56) References Cited

U.S. PATENT DOCUMENTS

| | | | | |
|---|---|---|---|---|
| 2006/0285391 | A1* | 12/2006 | Cernea | G11C 11/5642 |
| | | | | 365/185.22 |
| 2008/0117092 | A1* | 5/2008 | Wolf | H03M 1/168 |
| | | | | 341/161 |
| 2010/0321227 | A1* | 12/2010 | Hales | H03M 1/146 |
| | | | | 341/158 |
| 2011/0110175 | A1* | 5/2011 | Chang | G11C 11/40626 |
| | | | | 365/222 |
| 2014/0293102 | A1* | 10/2014 | Vogelsang | H04N 5/3355 |
| | | | | 348/294 |

* cited by examiner

MULTI-BIT CURRENT SENSE AMPLIFIER WITH PIPELINE CURRENT SAMPLING OF RESISTIVE MEMORY ARRAY STRUCTURE AND SENSING METHOD THEREOF

BACKGROUND

Technical Field

The present disclosure relates to a multi-bit current sense amplifier of a resistive memory array structure and a sensing method thereof. More particularly, the present disclosure relates to a multi-bit current sense amplifier with pipeline current sampling of a resistive memory array structure and a sensing method thereof.

Description of Related Art

Many security-aware mobile devices, using secure hash algorithm (SHA) or advanced encryption standard (AES) functions for data encryption, require short read access time ($T_{AC}$) and wide-IO from non-volatile memory (NVM) for high read bandwidth function. A spin torque transfer magnetoresistive random access memory (STT-MRAM) is the major on-chip NVM for advanced process nodes; however, it requires small-offset sense amplifiers (SAs) for robust read against small TMR-ratio at the expense of large area overhead and read-energy ($E_{RD}$). A study of STT-M RAM macros for security-related applications imposes two main challenges. One of the two main challenges is that using a large number of SAs for parallel wide-IO readout achieves short $T_{AC}$, but results in high peak current ($I_{PEAK}$) and large area overhead. Using fewer SAs for sequential wide-IO readout reduces $I_{PEAK}$ and area overhead, but imposes long $T_{AC}$ and low read-bandwidth ($B_{WR}$). Another one of the two main challenges is that MRAM macros with high $I_{PEAK}$ degrade the power supply voltage (VDD) integrity of the chip, often leading to failure in noise-sensitive blocks on the same chip.

Therefore, a multi-bit current sense amplifier with pipeline current sampling of a resistive memory and a sensing method thereof having the features of margin enhancement, offset suppression, small area, low peak current and low energy consumption capability are commercially desirable.

SUMMARY

According to one aspect of the present disclosure, a multi-bit current sense amplifier with pipeline current sampling of a resistive memory is configured to sense a plurality of bit line currents of a plurality of bit lines in a pipeline operation. The multi-bit current sense amplifier with pipeline current sampling of the resistive memory includes a core sense circuit and a plurality of bit line precharge branch circuits. The core sense circuit has a first output node and a second output node. The core sense circuit is connected to one part of the bit lines and generates a reference parallel resistance current and a reference anti-parallel resistance current. The bit line precharge branch circuits are electrically connected to the core sense circuit. The bit line precharge branch circuits are connected to another part of the bit lines. The bit line currents of the bit lines, the reference parallel resistance current and the reference anti-parallel resistance current are sensed by the core sense circuit and the bit line precharge branch circuits in the pipeline operation so as to sequentially generate a plurality of voltage levels on the first output node and the second output node in a clock cycle.

According to another aspect of the present disclosure, a sensing method of the multi-bit current sense amplifier with pipeline current sampling of the resistive memory includes a voltage level applying step, a first part bit line current sensing step and a second part bit line current sensing step. The voltage level applying step is performed to apply a plurality of voltage levels to a plurality of control signals, respectively. The control signals are configured to control the core sense circuit and the bit line precharge branch circuits. The first part bit line current sensing step is performed to sense the bit line currents of the one part of the bit lines via the core sense circuit according to the voltage levels of the control signals. The second part bit line current sensing step is performed to sense the bit line currents of the another part of the bit lines via the core sense circuit and the bit line precharge branch circuits according to the voltage levels of the control signals.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
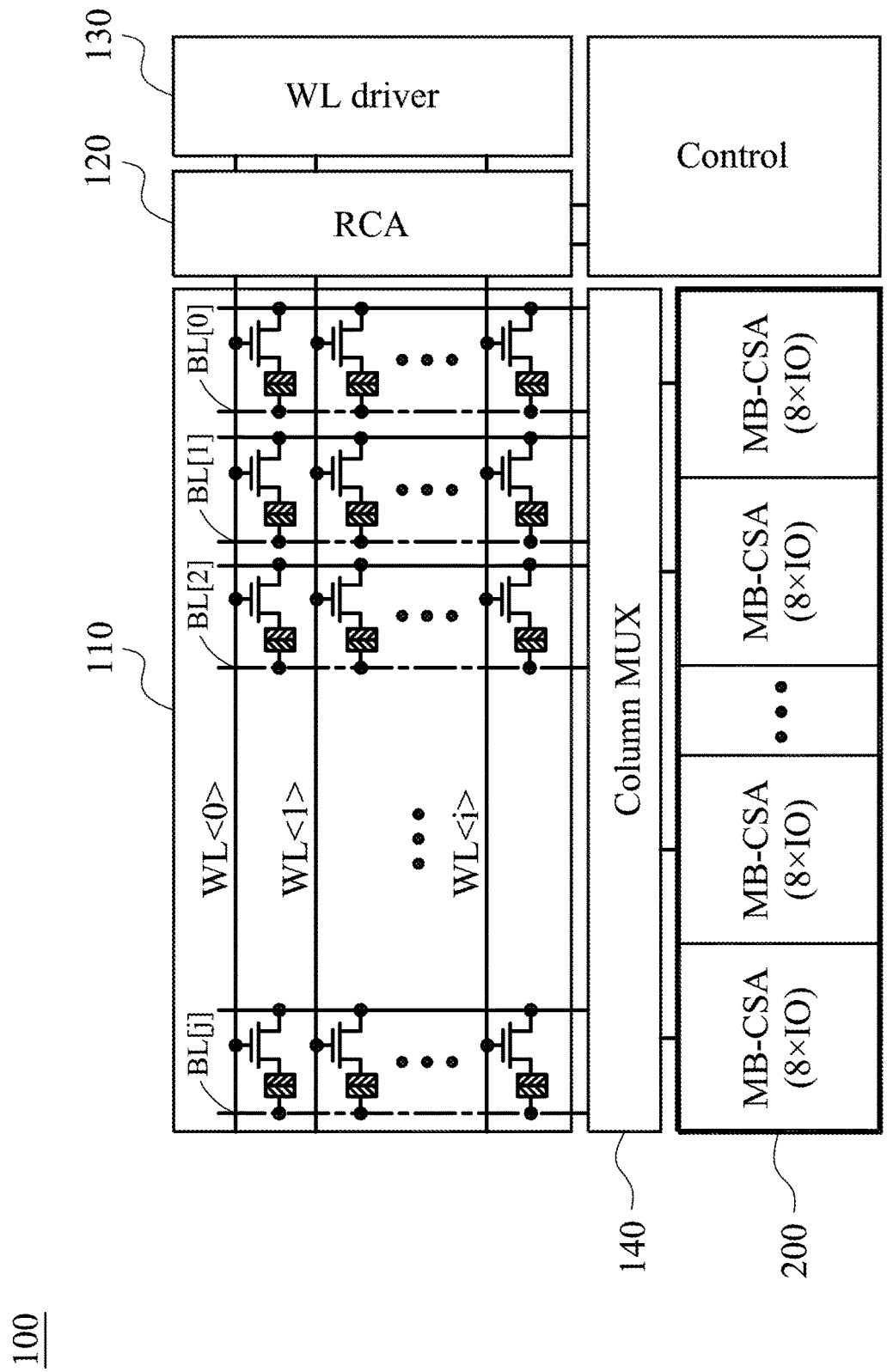
FIG. 1 shows a block diagram of a resistive memory array structure according to one embodiment of the present disclosure.
Figure 2:
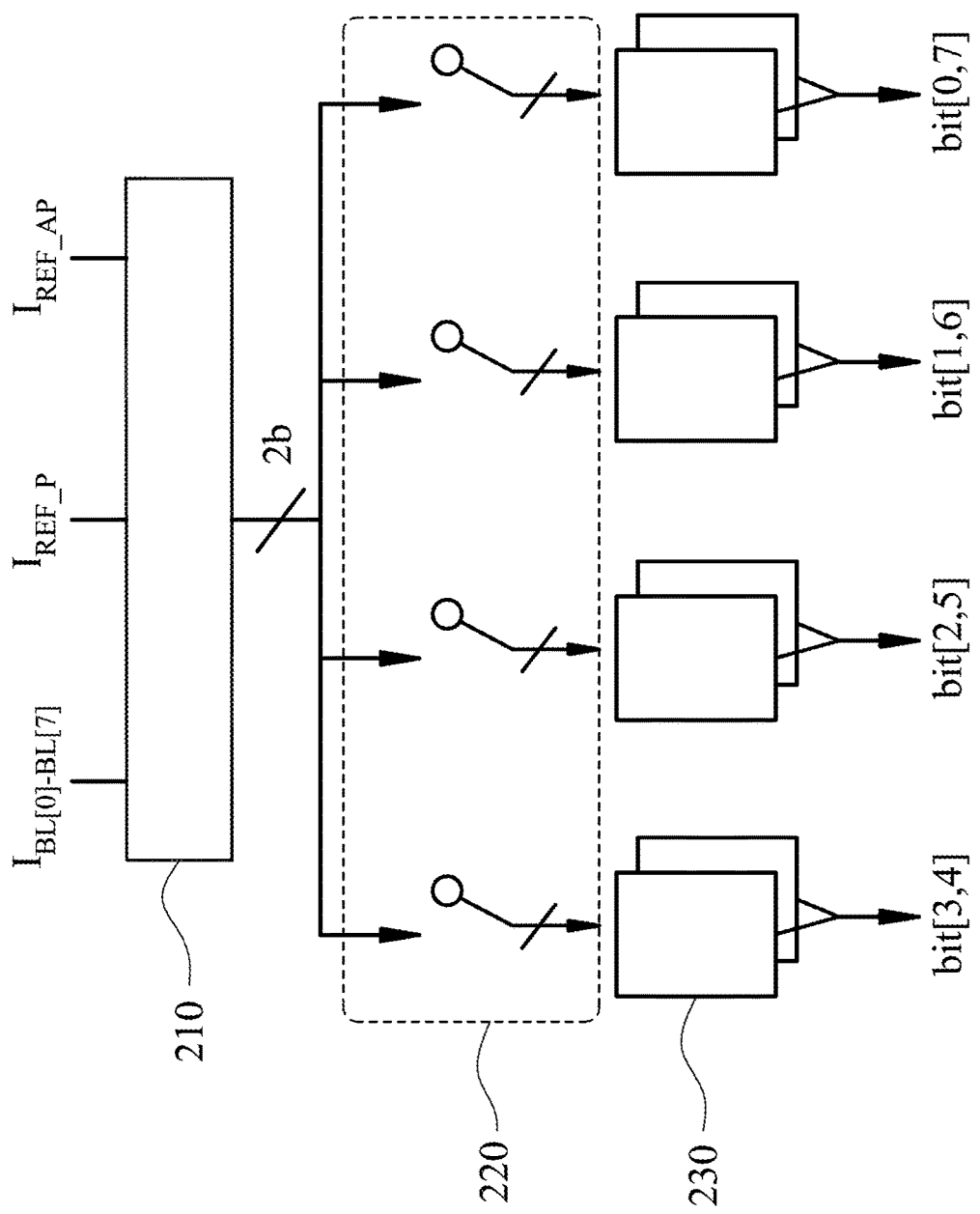
FIG. 2 shows a block diagram of a multi-bit current sense amplifier with pipeline current sampling of the resistive memory array structure of FIG. 1.
Figure 3:
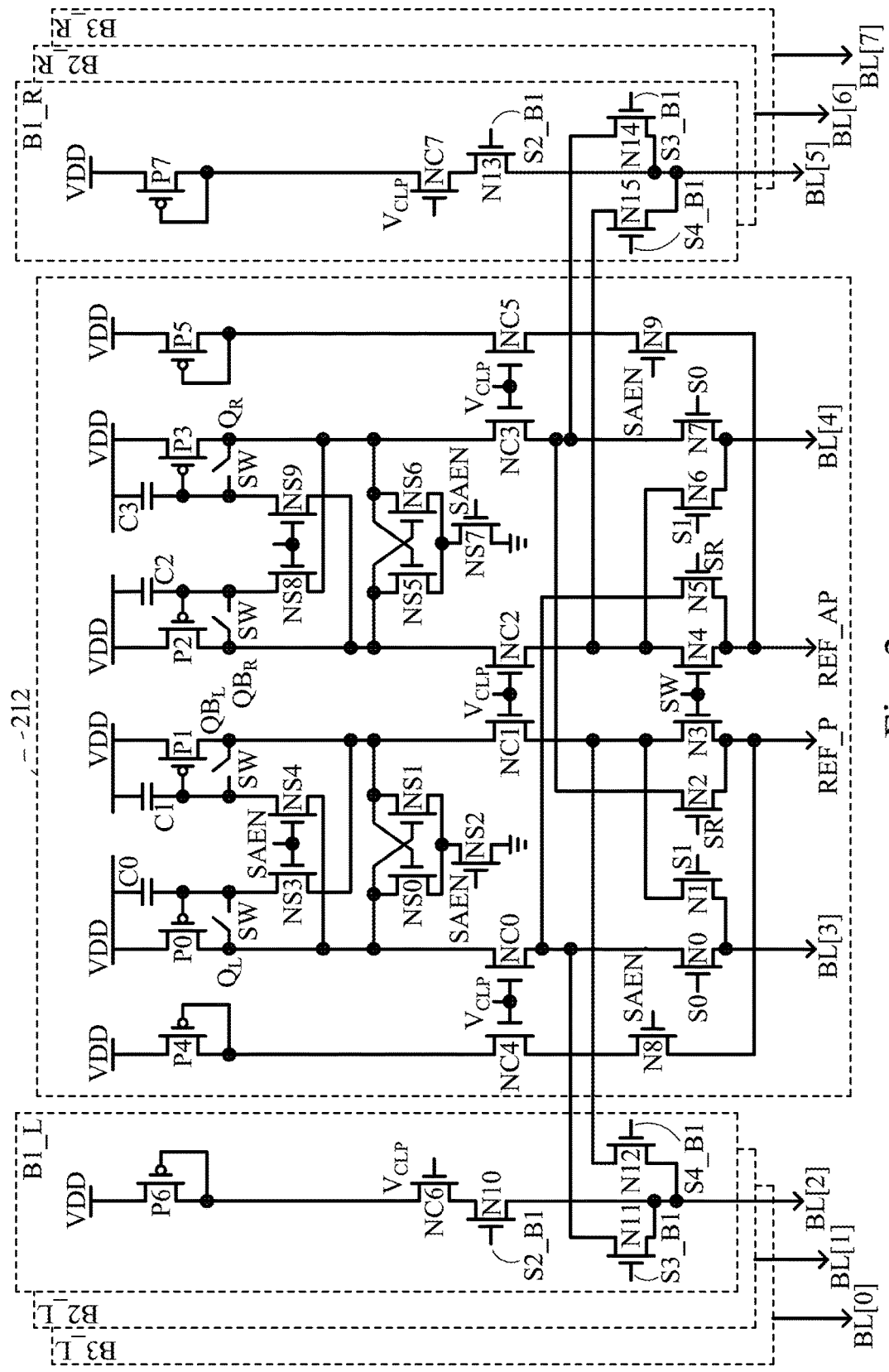
FIG. 3 shows a circuit diagram of a core sense circuit of the multi-bit current sense amplifier of FIG. 2, connected to a first left bit line precharge branch circuit and a first right bit line precharge branch circuit.
Figure 4:
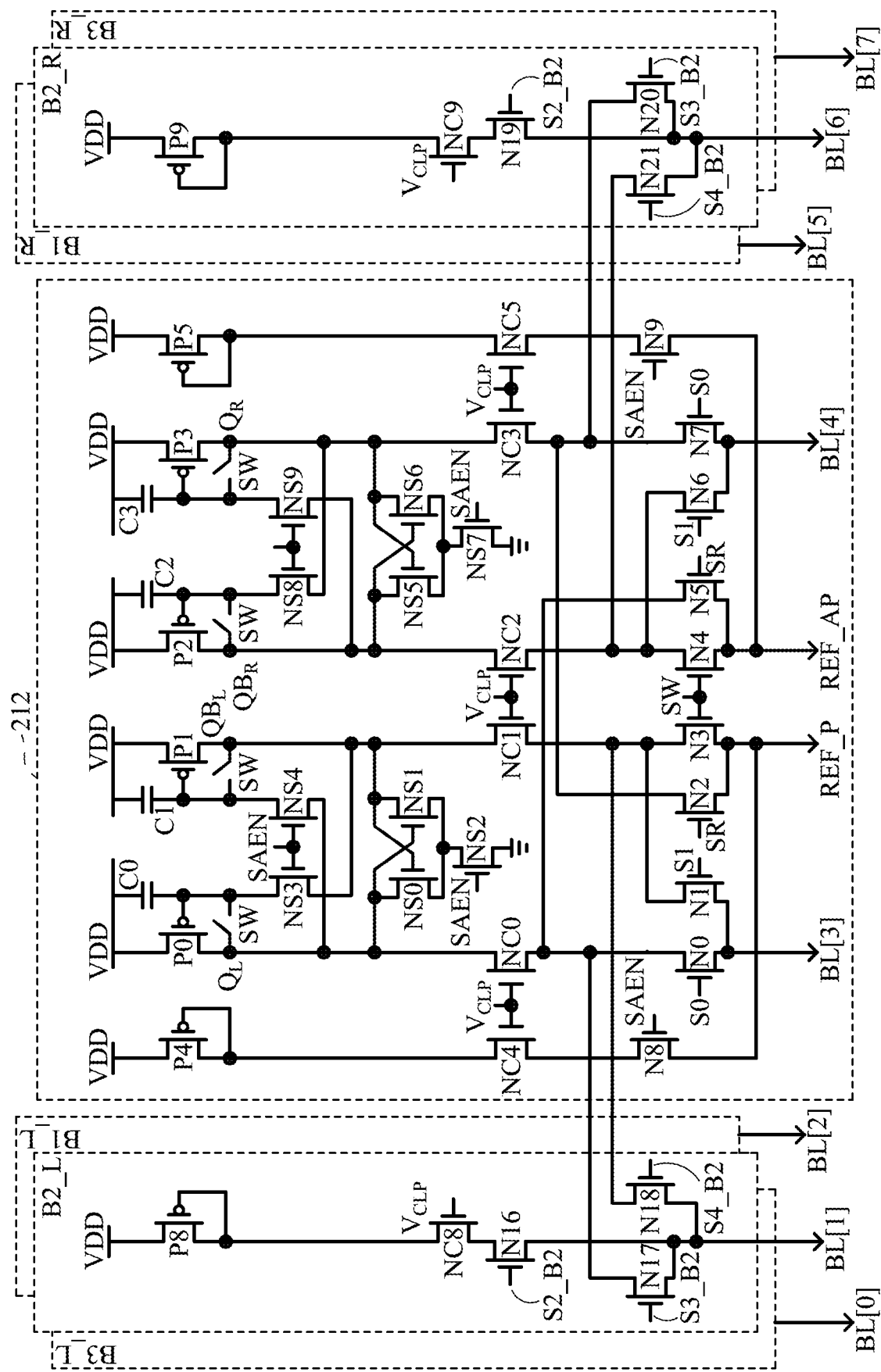
FIG. 4 shows a circuit diagram of the core sense circuit of the multi-bit current sense amplifier of FIG. 2, connected to a second left bit line precharge branch circuit and a second right bit line precharge branch circuit.
Figure 5:
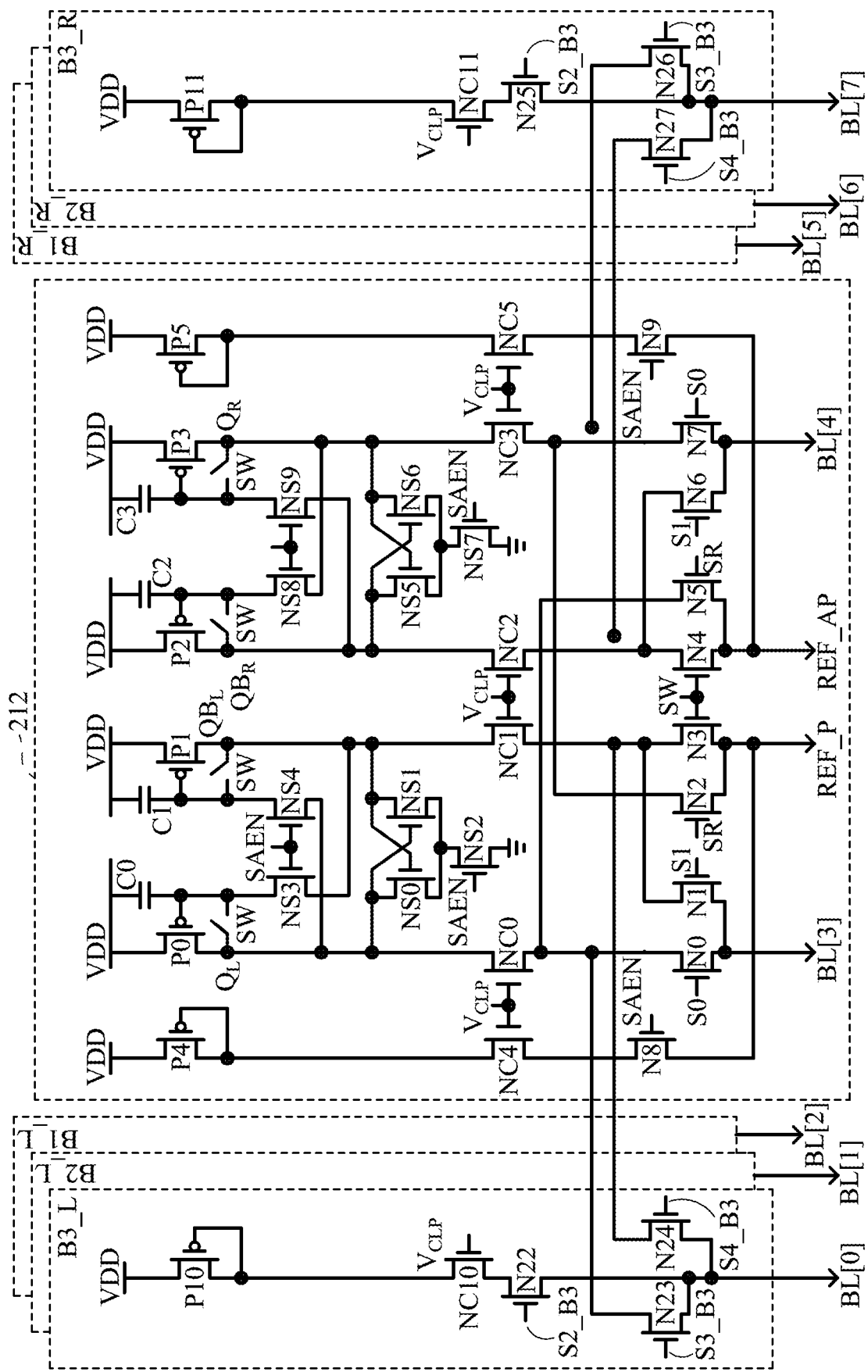
FIG. 5 shows a circuit diagram of the core sense circuit of the multi-bit current sense amplifier of FIG. 2, connected to a third left bit line precharge branch circuit and a third right bit line precharge branch circuit.

FIG. 1 shows a block diagram of a resistive memory array structure 100 according to one embodiment of the present disclosure. FIG. 2 shows a block diagram of a multi-bit current sense amplifier 200 with pipeline current sampling of the resistive memory array structure 100 of FIG. 1. FIG. 3 shows a circuit diagram of a core sense circuit 212 of the multi-bit current sense amplifier 200 of FIG. 2, connected to a first left bit line precharge branch circuit B1_L and a first right bit line precharge branch circuit B1_R. FIG. 4 shows a circuit diagram of the core sense circuit 212 of the multi-bit current sense amplifier 200 of FIG. 2, connected to a second left bit line precharge branch circuit B2_L and a second right bit line precharge branch circuit B2_R. FIG. 5 shows a circuit diagram of the core sense circuit 212 of the multi-bit current sense amplifier 200 of FIG. 2, connected to a third left bit line precharge branch circuit B3_L and a third right bit line precharge branch circuit B3_R. In FIGS. 1-5, the resistive memory array structure 100 includes a non-volatile memory array 110, a replica cell array 120 (i.e., RCA), a word line driver 130 (i.e., WL driver), a multiplexer unit 140 (i.e., Column MUX) and a plurality of multi-bit current sense amplifiers 200 (i.e., MB-CSA).

The non-volatile memory array 110 includes a plurality of non-volatile memory cells. Each of the non-volatile memory cells is controlled by one of the word lines WL<0>-WL<i> and stores a weight. Each of the non-volatile memory cells may be a spin torque transfer magnetoresistive random access memory (STT-MRAM). Each of the non-volatile memory cells includes a transistor and a resistive element. The transistor is connected to a source line and one of the word lines WL<0>-WL<i>. The resistive element is connected between the transistor and one of the bit lines. The replica cell array 120 is connected between the non-volatile memory array 110 and the word line driver 130. The multiplexer unit 140 is connected between the non-volatile memory array 110 and the multi-bit current sense amplifiers 200. The bit lines of the non-volatile memory array 110 are connected to the multi-bit current sense amplifiers 200 via the multiplexer unit 140.

Each of the multi-bit current sense amplifiers 200 with pipeline current sampling of the resistive memory array structure 100 is configured to sense a plurality of bit line currents of the bit lines in a pipeline operation. The multi-bit current sense amplifier 200 includes a multi-bit current sense circuit 210, a multi-bit output switch unit 220 and a plurality of output latches 230.

The multi-bit current sense circuit 210 includes a core sense circuit 212 and a plurality of bit line precharge branch circuits (e.g., B1_L, B1_R, B2_L, B2_R, B3_L, B3_R in FIG. 3). The core sense circuit 212 has a first output node $Q_L$ and a second output node $Q_R$. The core sense circuit 212 is connected to one part of the bit lines and generates a reference parallel resistance current $I_{REF\_P}$ and a reference anti-parallel resistance current $I_{REF\_AP}$. The bit line precharge branch circuits are electrically connected to the core sense circuit 212. The bit line precharge branch circuits are connected to another part of the bit lines. The bit line currents $I_{BL[0]}$-$I_{BL[7]}$ of the bit lines, the reference parallel resistance current $I_{REF\_P}$ and the reference anti-parallel resistance current $I_{REF\_AP}$ are sensed by the core sense circuit 212 and the bit line precharge branch circuits in the pipeline operation so as to sequentially generate a plurality of voltage levels on the first output node $Q_L$ and the second output node $Q_R$ in a clock cycle. In FIG. 3, the bit lines include a first bit line BL[0], a second bit line BL[1], a third bit line BL[2], a fourth bit line BL[3], a fifth bit line BL[4], a sixth bit line BL[5], a seventh bit line BL[6] and an eighth bit line BL[7]. The one part of the bit lines includes the fourth bit line BL[3] and the fifth bit line BL[4]. The another part of the bit lines includes the first bit line BL[0], the second bit line BL[1], the third bit line BL[2], the sixth bit line BL[5], the seventh bit line BL[6] and the eighth bit line BL[7].

In detail, the core sense circuit 212 further has a third output node $QB_L$, a fourth output node $QB_R$, a first left inner node, a second left inner node, a third left inner node, a fourth left inner node, a fifth left inner node, a first right inner node, a second right inner node, a third right inner node, a fourth right inner node, a fifth right inner node, a first bit line node, a second bit line node, a first reference node REF_P and a second reference node REF_AP. The core circuit 212 includes a first left sense-amplifier transistor P0, a second left sense-amplifier transistor P1, a third left sense-amplifier transistor NS0, a fourth left sense-amplifier transistor NS1, a fifth left sense-amplifier transistor NS2, a sixth left sense-amplifier transistor NS3, a seventh left sense-amplifier transistor NS4, a first left sense-amplifier capacitor C0, a second left sense-amplifier capacitor C1, a first left sense-amplifier switch and a second left sense-amplifier switch.

The first left sense-amplifier transistor P0 is connected to the power supply voltage VDD, the first output node $Q_L$ and the first left inner node. The second left sense-amplifier transistor P1 is connected to the power supply voltage VDD, the third output node $QB_L$ and the second left inner node. The third left sense-amplifier transistor NS0 is connected to the first output node $Q_L$, the third left inner node and the third output node $QB_L$. The fourth left sense-amplifier transistor NS1 is connected to the third output node $QB_L$, the third left inner node and the first output node $Q_L$. The fifth left sense-amplifier transistor NS2 is connected to the third left inner node, a sense amplifier enable signal SAEN and the ground voltage. The sixth left sense-amplifier transistor NS3 is connected to the first left inner node, the sense amplifier enable signal SAEN and the third output node $QB_L$. The seventh left sense-amplifier transistor NS4 is connected to the second left inner node, the sense amplifier enable signal SAEN and the first output node $Q_L$. The first left sense-amplifier capacitor C0 is connected between the power supply voltage VDD and the first left inner node. The second left sense-amplifier capacitor C1 is connected between the power supply voltage VDD and the second left inner node. The first left sense-amplifier switch is connected between the first output node $Q_L$ and the first left inner node. The first left sense-amplifier switch is controlled by a switching control signal SW. The second left sense-amplifier switch is connected between the third output node $QB_E$ and the second left inner node. The second left sense-amplifier switch is controlled by the switching control signal SW. Each of the first left sense-amplifier transistor P0 and the second left sense-amplifier transistor P1 is the PMOS transistor. Each of the third left sense-amplifier transistor NS0, the fourth left sense-amplifier transistor NS1, the fifth left sense-amplifier transistor NS2, the sixth left sense-amplifier transistor NS3 and the seventh left sense-amplifier transistor NS4 is the NMOS transistor.

The core sense circuit 212 further includes a first right sense-amplifier transistor P2, a second right sense-amplifier transistor P3, a third right sense-amplifier transistor NS5, a fourth right sense-amplifier transistor NS6, a fifth right sense-amplifier transistor NS7, a sixth right sense-amplifier transistor NS8, a seventh right sense-amplifier transistor NS9, a first right sense-amplifier capacitor C2, a second right sense-amplifier capacitor C3, a first right sense-amplifier switch and a second right sense-amplifier switch.

The first right sense-amplifier transistor P2 is connected to the power supply voltage VDD, the fourth output node $QB_R$ and the first right inner node. The second right sense-amplifier transistor P3 is connected to the power supply voltage VDD, the second output node $Q_R$ and the second right inner node. The third right sense-amplifier transistor NS5 is connected to the fourth output node $QB_R$, the third right inner node and the second output node $Q_R$. The fourth right sense-amplifier transistor NS6 is connected to the second output node $Q_R$, the third right inner node and the fourth output node $QB_R$. The fifth right sense-amplifier transistor NS7 is connected to the third right inner node, the sense amplifier enable signal SAEN and the ground voltage. The sixth right sense-amplifier transistor NS8 is connected to the first right inner node, the sense amplifier enable signal SAEN and the second output node $Q_R$. The seventh right sense-amplifier transistor NS9 is connected to the second right inner node, the sense amplifier enable signal SAEN and the fourth output node $QB_R$. The first right sense-amplifier capacitor C2 is connected between the power supply voltage VDD and the first right inner node. The second right sense-amplifier capacitor C3 is connected between the power supply voltage VDD and the second right inner node. The first right sense-amplifier switch is connected between the fourth output node $QB_R$ and the first right inner node. The first right sense-amplifier switch is controlled by the switching control signal SW. The second right sense-amplifier switch is connected between the second output node $Q_R$ and the second right inner node. The second right sense-amplifier switch is controlled by the switching control signal SW. Each of the first right sense-amplifier transistor P2 and the second right sense-amplifier transistor P3 is the PMOS transistor. Each of the third right sense-amplifier transistor NS5, the fourth right sense-amplifier transistor NS6, the fifth right sense-amplifier transistor NS7, the sixth right sense-amplifier transistor NS8 and the seventh right sense-amplifier transistor NS9 is the NMOS transistor.

The core sense circuit 212 further includes a first clamping transistor NC0, a second clamping transistor NC1, a third clamping transistor NC2 and a fourth clamping transistor NC3. The first clamping transistor NC0 is connected to a clamping signal $V_{CLP}$, the first output node $Q_L$ and the fourth left inner node. The second clamping transistor NC1 is connected to the clamping signal $V_{CLP}$, the third output node $QB_E$ and the fifth left inner node. The third clamping transistor NC2 is connected to the clamping signal $V_{CLP}$, the fourth output node $QB_R$ and the fourth right inner node. The fourth clamping transistor NC3 is connected to the clamping signal $V_{CLP}$, the second output node $Q_R$ and the fifth right inner node.

The core sense circuit 212 further includes a first left switching transistor N0, a second switching transistor N1, a third switching transistor N2, a fourth switching transistor N3, a fifth switching transistor N4, a sixth left switching transistor N5, a seventh switching transistor N6 and an eighth switching transistor N7. The first left switching transistor N0 is connected to the fourth left inner node, the first bit line node and a first switching signal S0. The second switching transistor N1 is connected to the fifth left inner node, the first bit line node and a second switching signal S1. The third switching transistor N2 is connected to the fifth right inner node, the first reference node REF_P and a switch reference signal SR. The fourth switching transistor N3 is connected to the fifth left inner node, the first reference node REF_P and the switching control signal SW. The fifth switching transistor N4 is connected to the fourth right inner node, the second reference node REF_AP and the switching control signal SW. The sixth left switching transistor N5 is connected to the fourth left inner node, the second reference node REF_AP and the switch reference signal SR. The seventh switching transistor N6 is connected to the fourth right inner node, the second bit line node and the second switching signal S1. The eighth switching transistor N7 is connected to the fifth right inner node, the second bit line node and the first switching signal S0. The reference parallel resistance current $I_{REF\_P}$ and the reference anti-parallel resistance current $I_{REF\_AP}$ flow through the first reference node REF_P and the second reference node REF_AP, respectively. Each of the first left switching transistor N0, the second switching transistor N1, the third switching transistor N2, the fourth switching transistor N3, the fifth switching transistor N4, the sixth left switching transistor N5, the seventh switching transistor N6 and the eighth switching transistor N7 is the NMOS transistor.

The core sense circuit 212 further includes an eighth left sense-amplifier transistor P4, a fifth clamping transistor NC4, a ninth left sense-amplifier transistor N8, an eighth right sense-amplifier transistor P5, a sixth clamping transistor NC5 and a ninth right sense-amplifier transistor N9. The eighth left sense-amplifier transistor P4 is connected to the power supply voltage VDD. The fifth clamping transistor NC4 is connected to the eighth left sense-amplifier transistor P4 and the clamping signal $V_{CLP}$. The ninth left sense-amplifier transistor N8 is connected to the fifth clamping transistor NC4, the sense amplifier enable signal SAEN and the first reference node REF_P. The eighth right sense-amplifier transistor P5 is connected to the power supply voltage VDD. The sixth clamping transistor NC5 is connected to the eighth right sense-amplifier transistor P5 and the clamping signal $V_{CLP}$. The ninth right sense-amplifier transistor N9 is connected to the sixth clamping transistor NC5, the sense amplifier enable signal SAEN and the second reference node REF_AP. Each of the eighth left sense-amplifier transistor P4 and the eighth right sense-amplifier transistor P5 is the PMOS transistor. Each of the fifth clamping transistor NC4, the ninth left sense-amplifier transistor N8, the sixth clamping transistor NC5 and the ninth right sense-amplifier transistor N9 is the NMOS transistor.

The bit line precharge branch circuits includes a first left bit line precharge branch circuit B1_L, a first right bit line precharge branch circuit B1_R, a second left bit line precharge branch circuit B2_L, a second right bit line precharge branch circuit B2_R, a third left bit line precharge branch circuit B3_L and a third right bit line precharge branch circuit B3_R.

The first left bit line precharge branch circuit B1_L has a third bit line node and includes a tenth left sense-amplifier transistor P6, a seventh clamping transistor NC6, an eleventh left sense-amplifier transistor N10, a twelfth left sense-amplifier transistor N11 and a thirteenth left sense-amplifier transistor N12. The tenth left sense-amplifier transistor P6 is connected to the power supply voltage VDD. The seventh clamping transistor NC6 is connected to the tenth left sense-amplifier transistor P6 and the clamping signal $V_{CLP}$. The eleventh left sense-amplifier transistor N10 is connected to the seventh clamping transistor NC6, a third switching signal S2_B1 and the third bit line node. The twelfth left sense-amplifier transistor N11 is connected to the fourth left inner node, a fourth switching signal S3_B1 and the third bit line node. The thirteenth left sense-amplifier transistor N12 is connected to the fifth left inner node, a fifth switching signal S4_B1 and the third bit line node. In addition, the first right bit line precharge branch circuit B1_R has a fourth bit line node and includes a tenth right sense-amplifier transistor P7, an eighth clamping transistor NC7, an eleventh right sense-amplifier transistor N13, a twelfth right sense-amplifier transistor N14 and a thirteenth right sense-amplifier transistor N15. The tenth right sense-amplifier transistor P7 is connected to the power supply voltage VDD. The eighth clamping transistor NC7 is connected to the tenth right sense-amplifier transistor P7 and the clamping signal $V_{CLP}$. The eleventh right sense-amplifier transistor N13 is connected to the eighth clamping transistor NC7, the third switching signal S2_B1 and the fourth bit line node. The twelfth right sense-amplifier transistor N14 is connected to the fifth right inner node, the fourth switching signal S3_B1 and the fourth bit line node. The thirteenth right sense-amplifier transistor N15 is connected to the fourth right inner node, the fifth switching signal S4_B1 and the fourth bit line node.

The second left bit line precharge branch circuit B2_L has a fifth bit line node and includes a fourteenth left sense-amplifier transistor P8, a ninth clamping transistor NC8, a fifteenth left sense-amplifier transistor N16, a sixteenth left sense-amplifier transistor N17 and a seventeenth left sense-amplifier transistor N18. The fourteenth left sense-amplifier transistor P8 is connected to the power supply voltage VDD. The ninth clamping transistor NC8 is connected to the fourteenth left sense-amplifier transistor P8 and the clamping signal $V_{CLP}$. The fifteenth left sense-amplifier transistor N16 is connected to the ninth clamping transistor NC8, a sixth switching signal S2_B2 and the fifth bit line node. The sixteenth left sense-amplifier transistor N17 is connected to the fourth left inner node, a seventh switching signal S3_B2 and the fifth bit line node. The seventeenth left sense-amplifier transistor N18 is connected to the fifth left inner node, an eighth switching signal S4_B2 and the fifth bit line node. In addition, the second right bit line precharge branch circuit B2_R has a sixth bit line node and includes a fourteenth right sense-amplifier transistor P9, a tenth clamping transistor NC9, a fifteenth right sense-amplifier transistor N19, a sixteenth right sense-amplifier transistor N20 and a seventeenth right sense-amplifier transistor N21. The fourteenth right sense-amplifier transistor P9 is connected to the power supply voltage VDD. The tenth clamping transistor NC9 is connected to the fourteenth right sense-amplifier transistor P9 and the clamping signal $V_{CLP}$. The fifteenth right sense-amplifier transistor N19 is connected to the tenth clamping transistor NC9, the sixth switching signal S2_B2 and the sixth bit line node. The sixteenth right sense-amplifier transistor N20 is connected to the fifth right inner node, the seventh switching signal S3_B2 and the sixth bit line node. The seventeenth right sense-amplifier transistor N21 is connected to the fourth right inner node, the eighth switching signal S4_B2 and the sixth bit line node.

The third left bit line precharge branch circuit B3_L has a seventh bit line node and includes an eighteenth left sense-amplifier transistor P10, an eleventh clamping transistor NC10, a nineteenth left sense-amplifier transistor N22, a twentieth left sense-amplifier transistor N23 and a twenty-first left sense-amplifier transistor N24. The eighteenth left sense-amplifier transistor P10 is connected to the power supply voltage VDD. The eleventh clamping transistor NC10 is connected to the eighteenth left sense-amplifier transistor P10 and the clamping signal $V_{CLP}$. The nineteenth left sense-amplifier transistor N22 is connected to the eleventh clamping transistor NC10, a ninth switching signal S2_B3 and the seventh bit line node. The twentieth left sense-amplifier transistor N23 is connected to the fourth left inner node, a tenth switching signal S3_B3 and the seventh bit line node. The twenty-first left sense-amplifier transistor N24 is connected to the fifth left inner node, an eleventh switching signal S4_B3 and the seventh bit line node. In addition, the third right bit line precharge branch circuit B3_R has an eighth bit line node and includes an eighteenth right sense-amplifier transistor P11, a twelfth clamping transistor NC11, a nineteenth right sense-amplifier transistor N25, a twentieth right sense-amplifier transistor N26 and a twenty-first right sense-amplifier transistor N27. The eighteenth right sense-amplifier transistor P11 is connected to the power supply voltage VDD. The twelfth clamping transistor NC11 is connected to the eighteenth right sense-amplifier transistor P11 and the clamping signal $V_{CLP}$. The nineteenth right sense-amplifier transistor N25 is connected to the twelfth clamping transistor NC11, the ninth switching signal S2_B3 and the eighth bit line node. The twentieth right sense-amplifier transistor N26 is connected to the fifth right inner node, the tenth switching signal S3_B3 and the eighth bit line node. The twenty-first right sense-amplifier transistor N27 is connected to the fourth right inner node, the eleventh switching signal S4_B3 and the eighth bit line node.

In FIGS. 3-5, the first bit line BL[0] and the eighth bit line BL[7] are connected to the seventh bit line node and the eighth bit line node, respectively. The second bit line BL[1] and the seventh bit line BL[6] are connected to the fifth bit line node and the sixth bit line node, respectively. The third bit line BL[2] and the sixth bit line BL[5] are connected to the third bit line node and the fourth bit line node, respectively. The fourth bit line BL[3] and the fifth bit line BL[4] are connected to the first bit line node and the second bit line node, respectively.

The multi-bit output switch unit 220 is electrically connected between the multi-bit current sense circuit 210 and the output latches 230. The multi-bit output switch unit 220 includes a plurality of multi-bit output switches (MBOSWs). The number of the multi-bit output switches is four. The multi-bit output switches are electrically connected to the first output node $Q_L$ and the second output node $Q_R$ of the multi-bit current sense circuit 210. Only one of the multi-bit output switches is turned on to transmit two voltage levels (2b) of the first output node $Q_L$ and the second output node $Q_R$ at one time.

The output latches 230 are electrically connected to the multi-bit output switch unit 220. The number of the output latches 230 is eight. Two of the output latches 230 are corresponding to one of the multi-bit output switches of the multi-bit output switch unit 220 and configured to generate two of eight 1-bit digital outputs (i.e., one of bit[3,4], bit[2,5], bit[1,6] and bit[0,7]).

Figure 6:
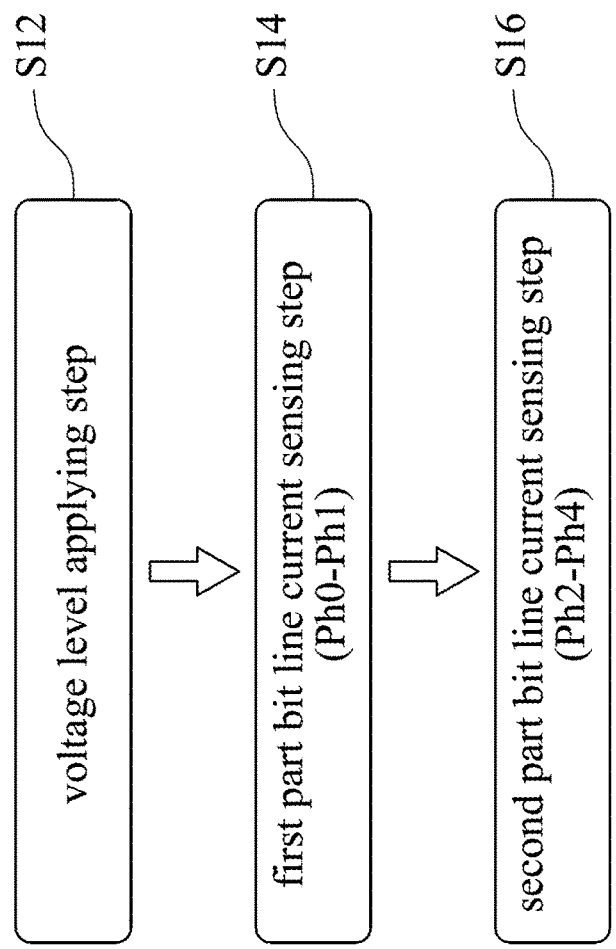
FIG. 6 shows a flow chart of a sensing method of a multi-bit current sense amplifier with pipeline current sampling of a resistive memory array structure according to another embodiment of the present disclosure.
Figure 7:
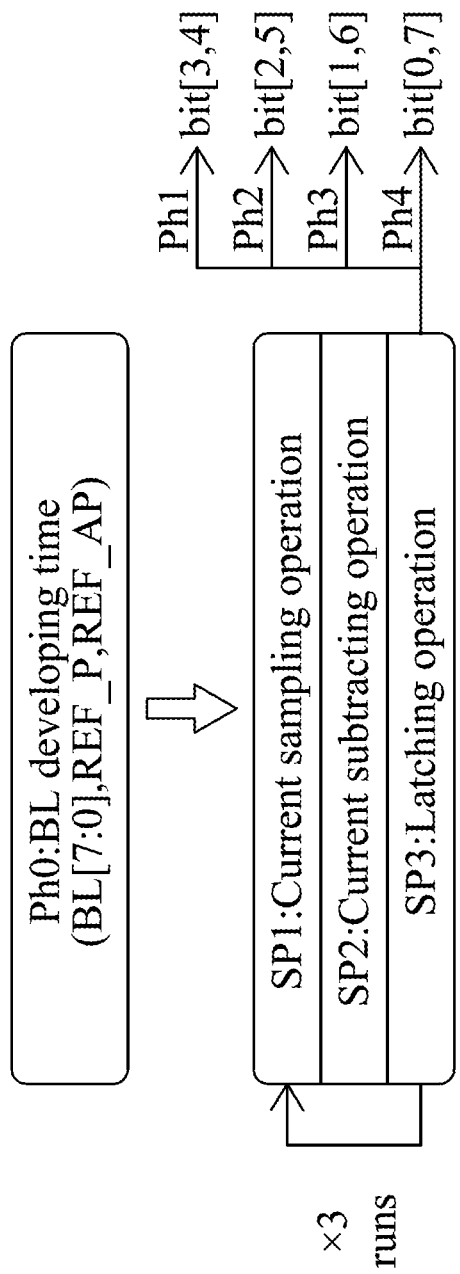
FIG. 7 shows a flow chart of current sampling operations, current subtracting operations and latching operations of the sensing method of FIG. 6.
Figure 8:
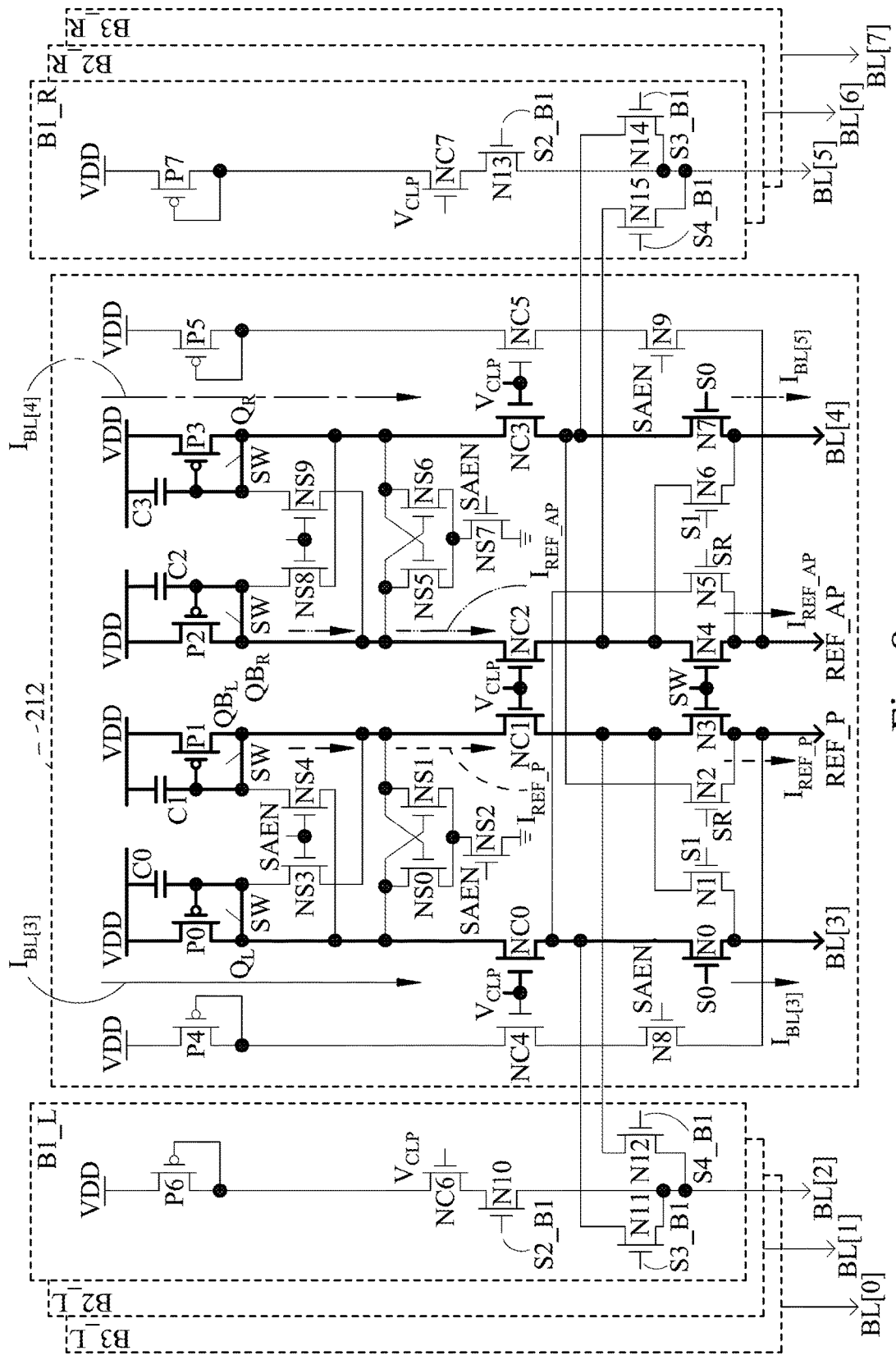
FIG. 8 shows a circuit diagram of a first current sampling operation of the sensing method of FIG. 6, during a core current sampling time interval of a sensing time interval.
Figure 9A:
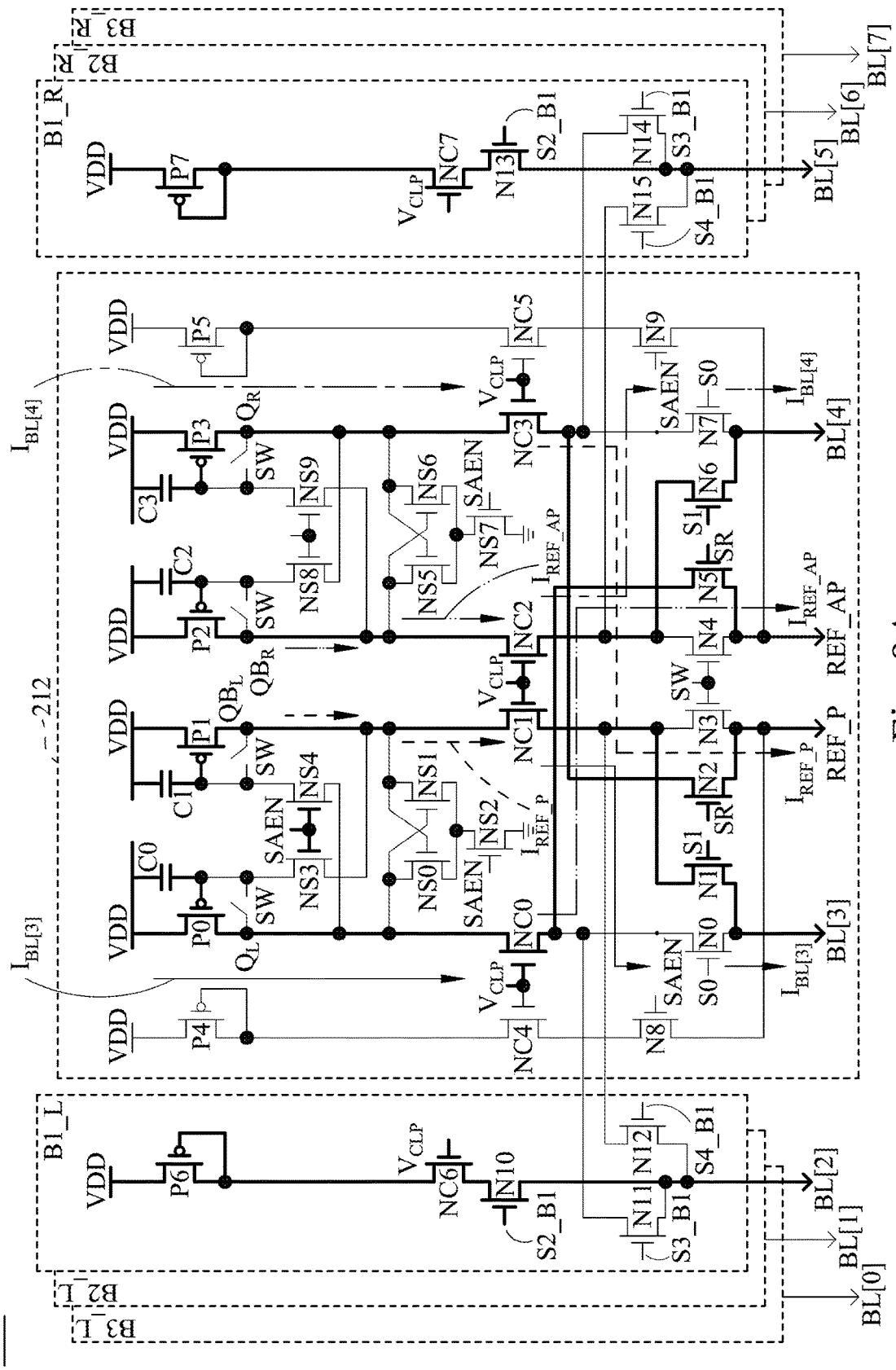
FIG. 9A shows a circuit diagram of a first current subtracting operation of the sensing method of FIG. 6, during a core current subtracting time interval of the sensing time interval.
Figure 9B:
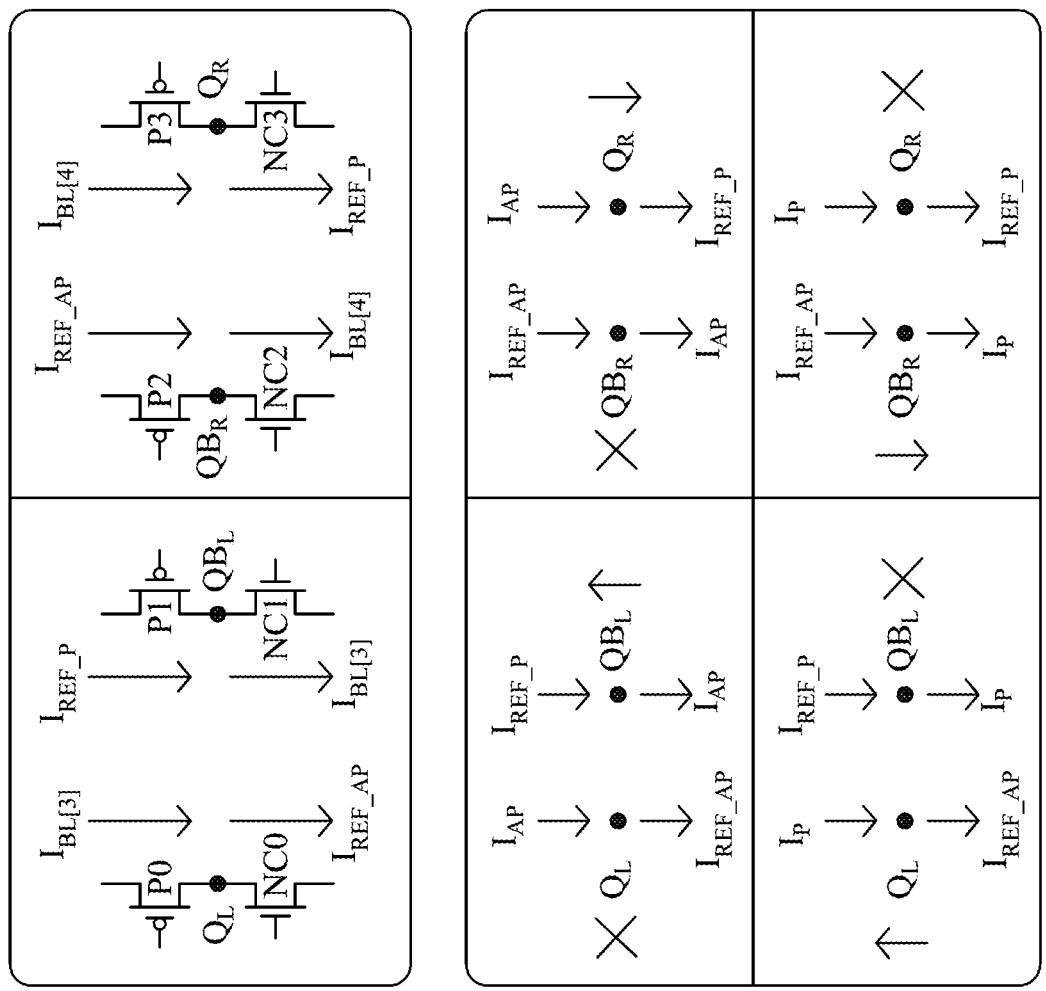
FIG. 9B shows a schematic view of variations of voltage levels of a first output node, a second output node, a third output node and a fourth output node of the core sense circuit in the first current subtracting operation of FIG. 9A, during the core current subtracting time interval of the sensing time interval.
Figure 10:
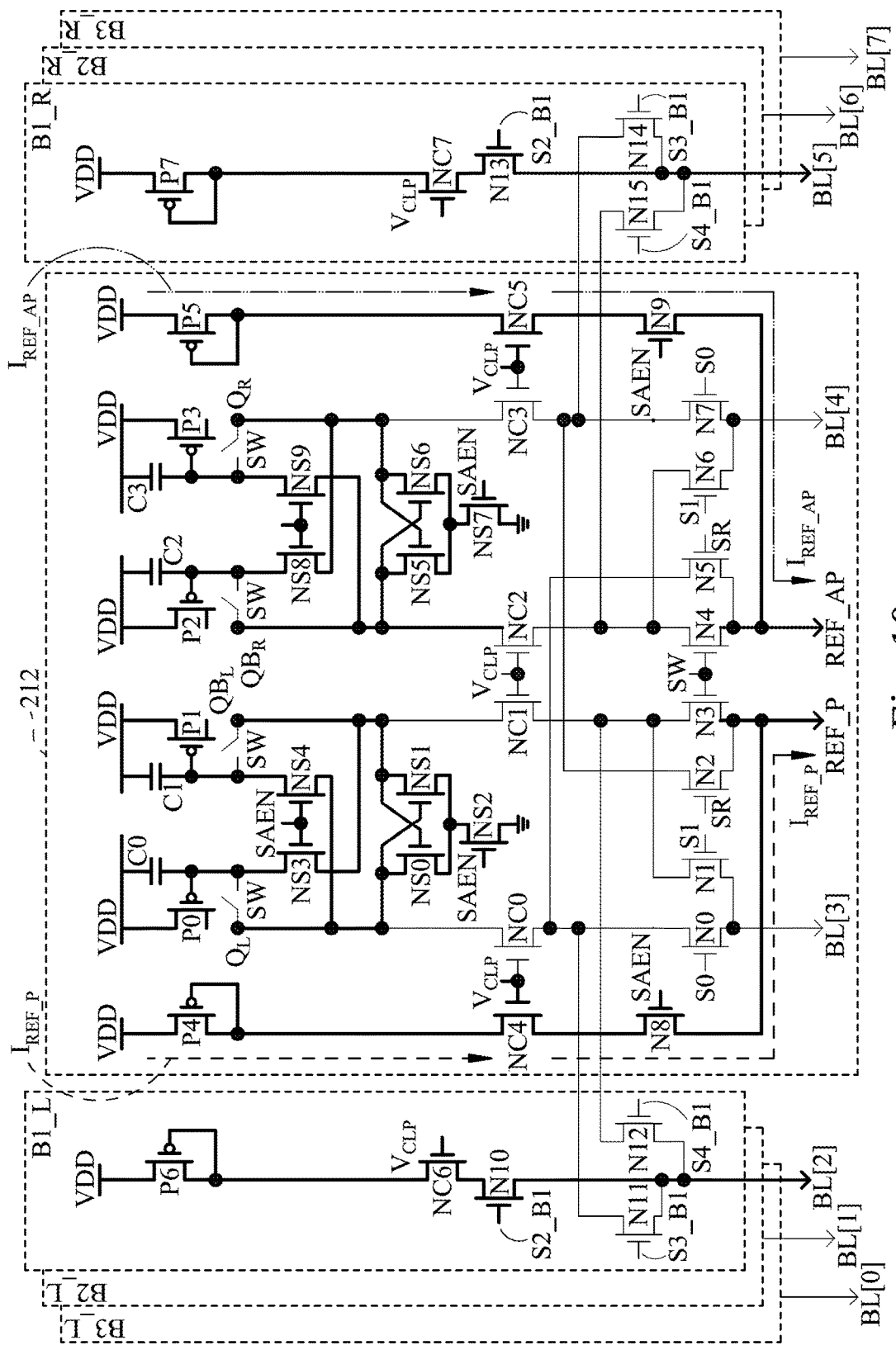
FIG. 10 shows a circuit diagram of a first latching operation of the sensing method of FIG. 6, during a core latching time interval of the sensing time interval.
Figure 11:
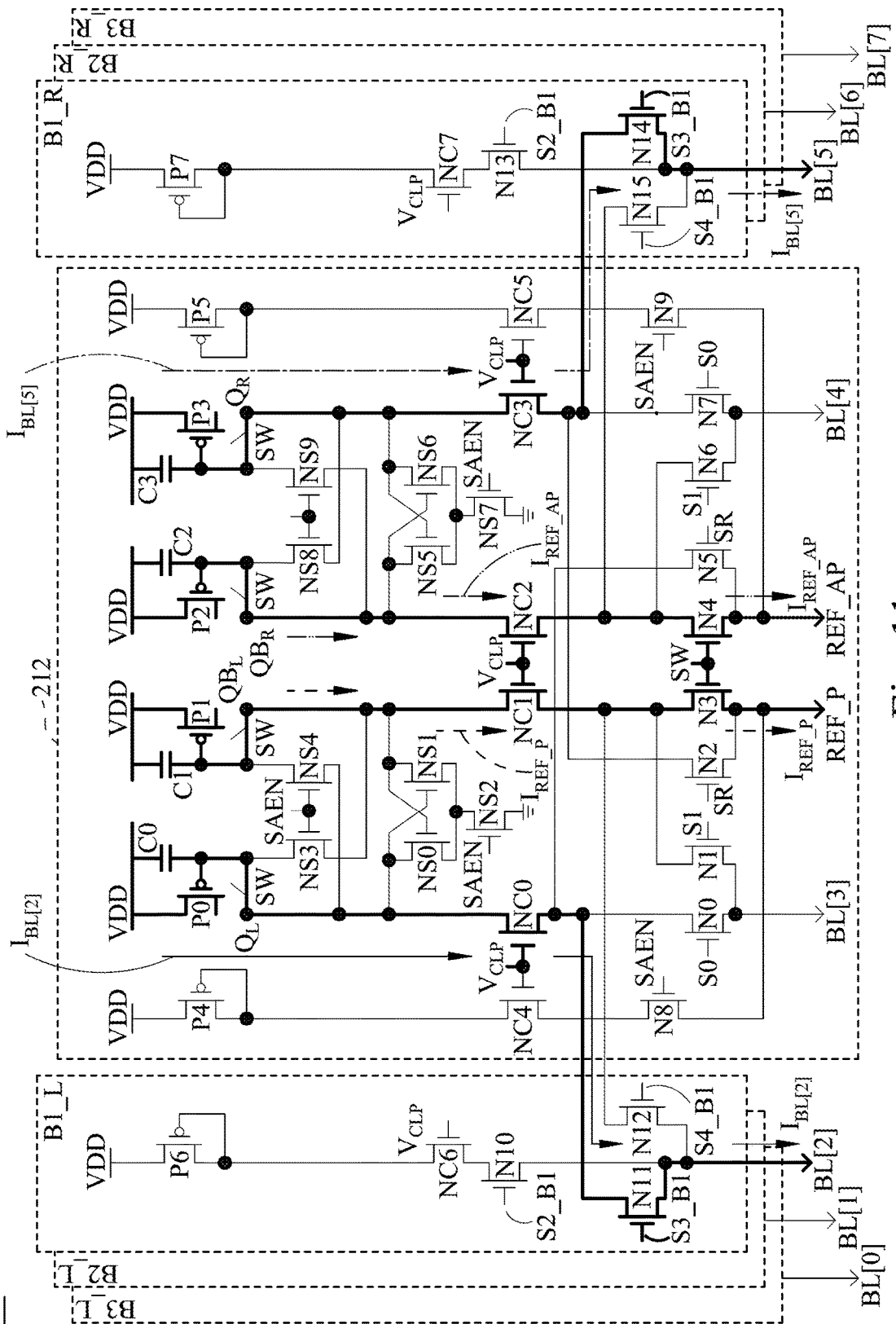
FIG. 11 shows a circuit diagram of a second current sampling operation of the sensing method of FIG. 6, during a first one of a plurality of branch current sampling time intervals of the sensing time interval.
Figure 12:
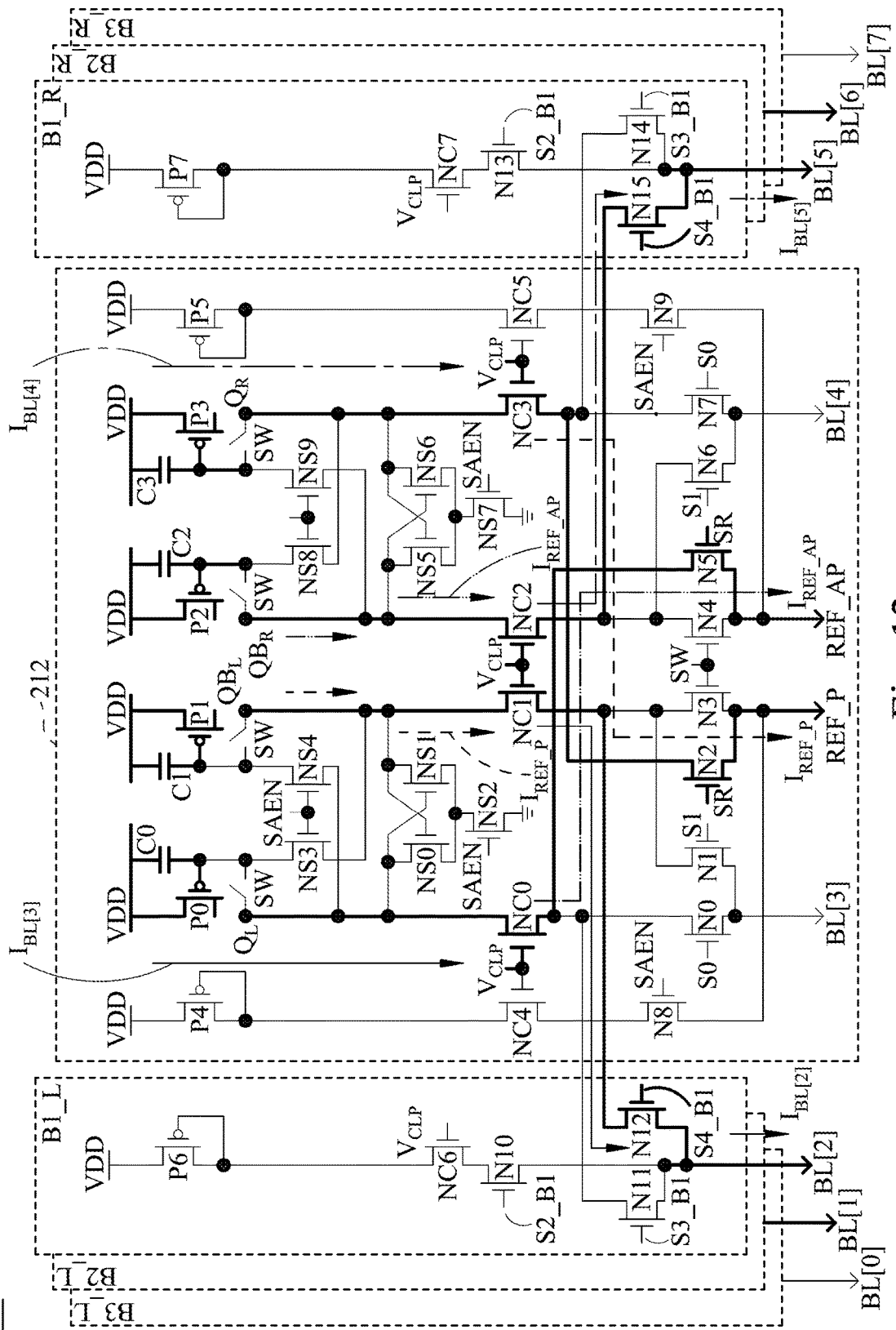
FIG. 12 shows a circuit diagram of a second current subtracting operation of the sensing method of FIG. 6, during a first one of a plurality of branch current subtracting time intervals of the sensing time interval.
Figure 13:
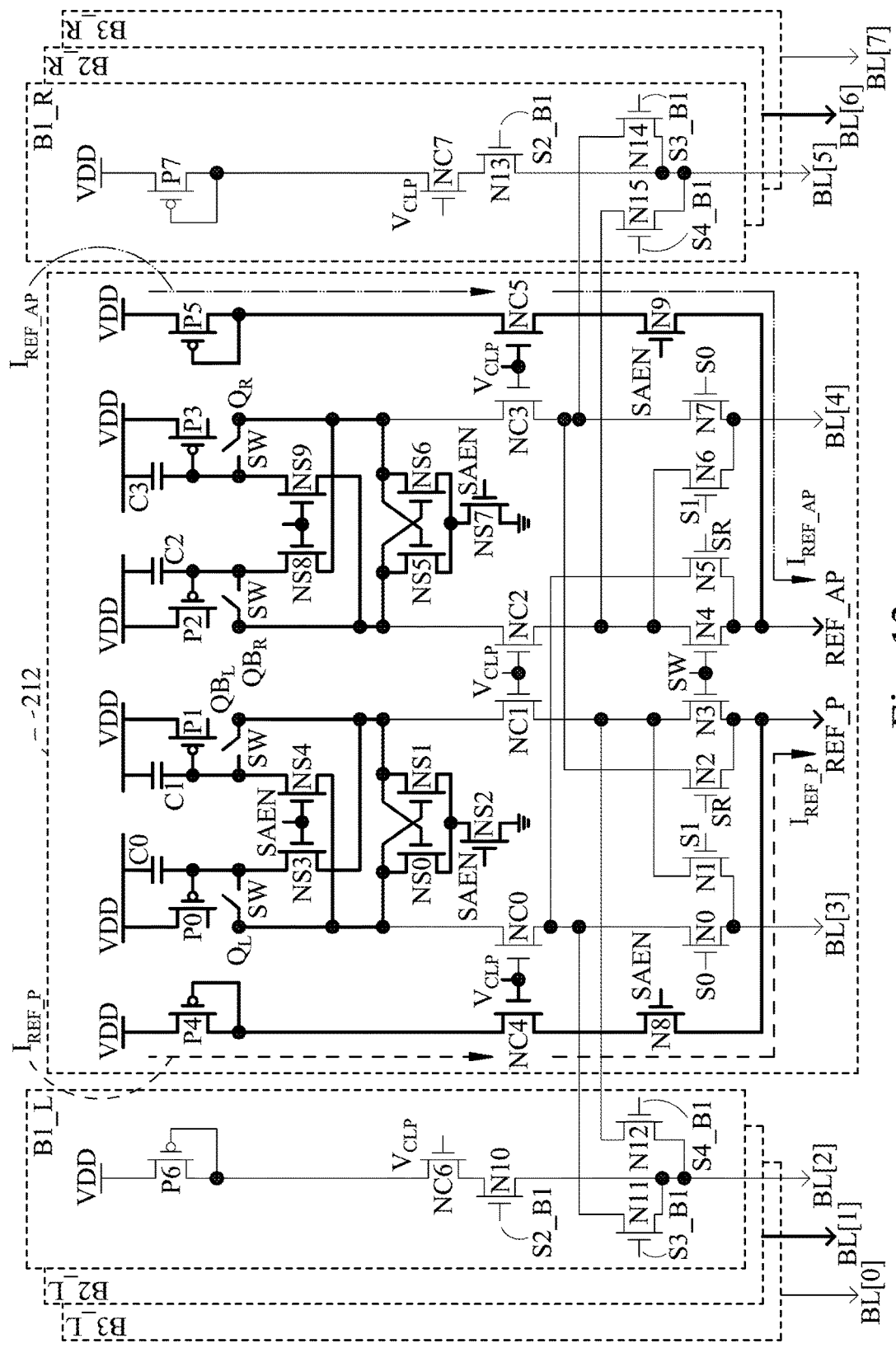
FIG. 13 shows a circuit diagram of a second latching operation of the sensing method of FIG. 6, during a first one of a plurality of branch latching time intervals of the sensing time interval.
Figure 14:
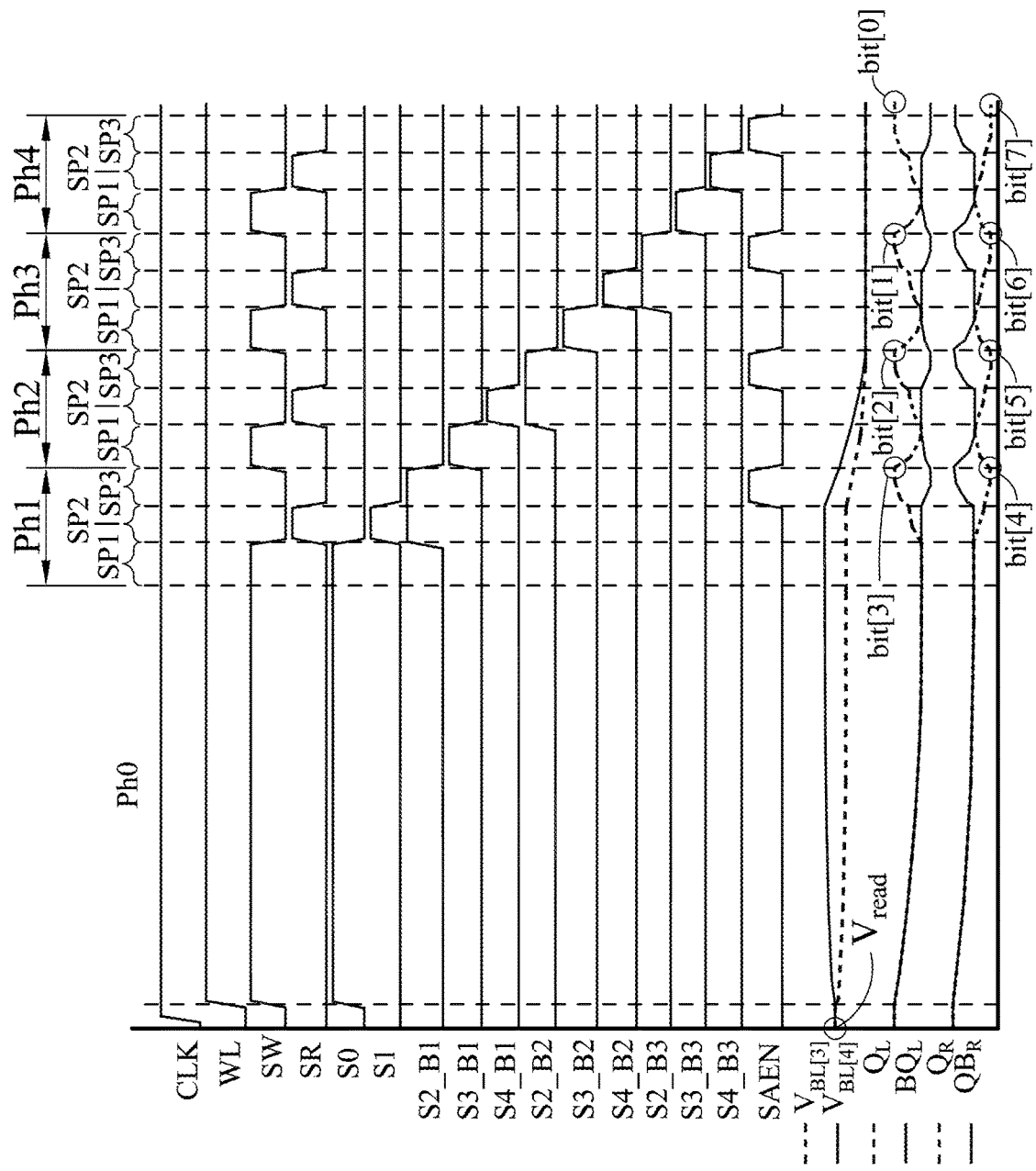
FIG. 14 shows timing diagrams of voltage levels of control signals, the first output node, the second output node, the third output node and the fourth output node of FIGS. 8-13.

FIG. 6 shows a flow chart of a sensing method 300 of a multi-bit current sense amplifier 200 with pipeline current sampling of a resistive memory array structure 100 according to another embodiment of the present disclosure. FIG. 7 shows a flow chart of current sampling operations (SP1), current subtracting operations (SP2) and latching operations (SP3) of the sensing method 300 of FIG. 6. FIG. 8 shows a circuit diagram of a first current sampling operation of the sensing method 300 of FIG. 6, during a core current sampling time interval (Ph1-SP1) of a sensing time interval (total of Ph1, Ph2, Ph3 and Ph4). FIG. 9A shows a circuit diagram of a first current subtracting operation of the sensing method 300 of FIG. 6, during a core current subtracting time interval (Ph1-SP2) of the sensing time interval. FIG. 9B shows a schematic view of variations of voltage levels of a first output node $Q_L$, a second output node $Q_R$, a third output node $QB_L$ and a fourth output node $QB_R$ of the core sense circuit 212 in the first current subtracting operation of FIG. 9A, during the core current subtracting time interval (Ph1-SP2) of the sensing time interval. FIG. 10 shows a circuit diagram of a first latching operation of the sensing method 300 of FIG. 6, during a core latching time interval (Ph1-SP3) of the sensing time interval. FIG. 11 shows a circuit diagram of a second current sampling operation of the sensing method 300 of FIG. 6, during a first one (Ph2-SP1) of a plurality of branch current sampling time intervals (total of Ph2-SP1, Ph3-SP1 and Ph4-SP1) of the sensing time interval. FIG. 12 shows a circuit diagram of a second current subtracting operation of the sensing method 300 of FIG. 6, during a first one (Ph2-SP2) of a plurality of branch current subtracting time intervals (total of Ph2-SP2, Ph3-SP2 and Ph4-SP2) of the sensing time interval. FIG. 13 shows a circuit diagram of a second latching operation of the sensing method 300 of FIG. 6, during a first one (Ph2-SP3) of a plurality of branch latching time intervals (total of Ph2-SP3, Ph3-SP3 and Ph4-SP3) of the sensing time interval. FIG. 14 shows timing diagrams of voltage levels of control signals, the first output node $Q_L$, the second output node $Q_R$, the third output node $QB_L$ and the fourth output node $QB_R$ of FIGS. 8-13. In FIG. 6, the sensing method 300 includes a voltage level applying step S12, a first part bit line current sensing step S14 and a second part bit line current sensing step S16.

The voltage level applying step S12 is performed to apply the voltage levels to the control signals, respectively. The control signals are configured to control the core sense circuit 212 and the bit line precharge branch circuits of the multi-bit current sense amplifier 200. In detail, the control signals include a switching control signal SW, a sense amplifier enable signal SAEN, a clamping signal $V_{CLP}$, a switch reference signal SR, a first switching signal S0, a second switching signal S1, a third switching signal S2_B1, a fourth switching signal S3_B1, a fifth switching signal S4_B1, a sixth switching signal S2_B2, a seventh switching signal S3_B2, an eighth switching signal S4_B2, a ninth switching signal S2_B3, a tenth switching signal S3_B3 and an eleventh switching signal S4_B3.

Please refer to FIGS. 3-5. The switching control signal SW is configured to control a first left sense-amplifier switch, a second left sense-amplifier switch, a first right sense-amplifier switch, a second right sense-amplifier switch, a fourth switching transistor N3 and a fifth switching transistor N4 of the core sense circuit 200. The sense amplifier enable signal SAEN is configured to control a fifth left sense-amplifier transistor N52, a sixth left sense-amplifier transistor N53, a seventh left sense-amplifier transistor N54, a fifth right sense-amplifier transistor NS7, a sixth right sense-amplifier transistor NS8, a seventh right sense-amplifier transistor NS9, a ninth left sense-amplifier transistor N8 and a ninth right sense-amplifier transistor N9 of the core sense circuit 200. The clamping signal $V_{CLP}$ is configured to control a first clamping transistor NC0, a second clamping transistor NC1, a third clamping transistor NC2, a fourth clamping transistor NC3, a fifth clamping transistor NC4 and a sixth clamping transistor NC5 of the core sense circuit 200, and a seventh clamping transistor NC6, an eighth clamping transistor NC7, a ninth clamping transistor NC8, a tenth clamping transistor NC9, an eleventh clamping transistor NC10 and a twelfth clamping transistor NC11 of the bit line precharge branch circuits. The switch reference signal SR is configured to control a third switching transistor N2 and a sixth left switching transistor N5 of the core sense circuit 200. The first switching signal S0 is configured to control a first left switching transistor N0 and an eighth switching transistor N7 of the core sense circuit 200. The second switching signal S1 is configured to control a second switching transistor N1 and a seventh switching transistor N6 of the core sense circuit 200. The third switching signal S2_B1 is configured to control an eleventh left sense-amplifier transistor N10 and an eleventh right sense-amplifier transistor N13 of the bit line precharge branch circuits.

The fourth switching signal S3_B1 is configured to control a twelfth left sense-amplifier transistor N11 and a twelfth right sense-amplifier transistor N14 of the bit line precharge branch circuits. The fifth switching signal S4_B1 is configured to control a thirteenth left sense-amplifier transistor N12 and a thirteenth right sense-amplifier transistor N15 of the bit line precharge branch circuits. The sixth switching signal S2_B2 is configured to control a fifteenth left sense-amplifier transistor N16 and a fifteenth right sense-amplifier transistor N19 of the bit line precharge branch circuits. The seventh switching signal S3_B2 is configured to control a sixteenth left sense-amplifier transistor N17 and a sixteenth right sense-amplifier transistor N20 of the bit line precharge branch circuits. The eighth switching signal S4_B2 is configured to control a seventeenth left sense-amplifier transistor N18 and a seventeenth right sense-amplifier transistor N21 of the bit line precharge branch circuits. The ninth switching signal S2_B3 is configured to control a nineteenth left sense-amplifier transistor N22 and a nineteenth right sense-amplifier transistor N25 of the bit line precharge branch circuits. The tenth switching signal S3_B3 is configured to control a twentieth left sense-amplifier transistor N23 and a twentieth right sense-amplifier transistor N26 of the bit line precharge branch circuits. The eleventh switching signal S4_B3 is configured to control a twenty-first left sense-amplifier transistor N24 and a twenty-first right sense-amplifier transistor N27 of the bit line precharge branch circuits.

The first part bit line current sensing step S14 is performed to sense the bit line currents ($I_{BL[3]}$, $I_{BL[4]}$) of the one part (BL[3], BL[4]) of the bit lines via the core sense circuit 200 according to the voltage levels of the control signals. The second part bit line current sensing step S16 is performed to sense the bit line currents ($I_{BL[0]}$-$I_{BL[2]}$, $I_{BL[5]}$-$I_{BL[7]}$) of the another part (BL[0]-BL[2], BL[5]-BL[7]) of the bit lines via the core sense circuit 200 and the bit line precharge branch circuits according to the voltage levels of the control signals. The first part bit line current sensing step S14 and the second part bit line current sensing step S16 are operated in a bit line developing time interval Ph0 and the sensing time interval. The sensing time interval follows the bit line developing time interval Ph0. Each of the bit lines is precharged to a read voltage $V_{read}$ before the bit line developing time interval Ph0 (e.g., $V_{BL[3]}$ of the fourth bit line BL[3] and $V_{BL[4]}$ of the fifth bit line BL[4] are precharged to the read voltage $V_{read}$ in FIG. 14), and the read voltage $V_{read}$ is smaller than the power supply voltage VDD and greater than the ground voltage.

During the bit line developing time interval Ph0 and a core current sampling time interval (Ph1-SP1) of the sensing time interval in the first part bit line current sensing step S14, a left bit line current path ($I_{P0}$=$I_{BL[3]}$), a reference parallel resistance current path ($I_{P1}$=$I_{REF\_P}$), a reference anti-parallel resistance current path ($I_{P2}$=$I_{REF\_AP}$) and a right bit line current path ($I_{P3}$=$I_{BL[4]}$) are formed, as shown in FIG. 8. The left bit line current path ($I_{P0}$=$I_{BL[3]}$) is formed by the first left sense-amplifier transistor P0, the first clamping transistor NC0, the first left switching transistor N0 and a fourth bit line BL[3]. The reference parallel resistance current path ($I_{P1}$=$I_{REF\_P}$) is formed by the second left sense-amplifier transistor P1, the second clamping transistor NC1, the fourth switching transistor N3 and a first reference node REF_P. The reference anti-parallel resistance current path ($I_{P2}$=$I_{REF\_AP}$) is formed by the first right sense-amplifier transistor P2, the third clamping transistor NC2, the fifth switching transistor N4 and a second reference node REF_AP. The right bit line current path ($I_{P3}$=$I_{BL[4]}$) is formed by the second right sense-amplifier transistor P3, the fourth clamping transistor NC3, the eighth switching transistor N7 and a fifth bit line BL[4].

During the core current subtracting time interval (Ph1-SP2) of the sensing time interval in the first part bit line current sensing step S14, a first left sense-amplifier capacitor C0 of the core sense circuit 200 stores a gate-source voltage of the first left sense-amplifier transistor P0, as shown in FIG. 9A. A second left sense-amplifier capacitor C1 of the core sense circuit 200 stores a gate-source voltage of the second left sense-amplifier transistor P1. A first right sense-amplifier capacitor C2 of the core sense circuit 200 stores a gate-source voltage of the first right sense-amplifier transistor P2. A second right sense-amplifier capacitor C3 of the core sense circuit 200 stores a gate-source voltage of the second right sense-amplifier transistor P3. Moreover, a first current subtracting path ($I_{BL[3]}$-$I_{REF\_AP}$) is formed by the first left sense-amplifier transistor P0, the first clamping transistor NC0, the sixth left switching transistor N5 and the second reference node REF_AP. A second current subtracting path ($I_{REF\_P}$-$I_{BL[3]}$) is formed by the second left sense-amplifier transistor P1, the second clamping transistor NC1, the second switching transistor N1 and the fourth bit line BL[3]. A third current subtracting path ($I_{REF\_AP}$-$I_{BL[4]}$) is formed by the first right sense-amplifier transistor P2, the third clamping transistor NC2, the seventh switching transistor N6 and the fifth bit line BL[4]. A fourth current subtracting path ($I_{BL[4]}$-$I_{REF\_P}$) is formed by the second right sense-amplifier transistor P3, the fourth clamping transistor NC3, the third switching transistor N2 and the first reference node REF_P.

In FIG. 9B, the variations of voltage levels of the first output node $Q_L$ and the third output node $QB_L$ depend on the bit line current $I_{BL[3]}$ of the first left sense-amplifier transistor P0, the reference parallel resistance current $I_{REF\_P}$ of the second left sense-amplifier transistor $P_1$, the reference anti-parallel resistance current $I_{REF\_AP}$ of the first clamping transistor NC0 and the bit line current $I_{BL[3]}$ of the second clamping transistor NC1. When the bit line current $I_{BL[3]}$ is equal to an anti-parallel resistance current $I_{AP}$, the reference parallel resistance current $I_{REF\_P}$ of the second left sense-amplifier transistor $P_1$ is different from the bit line current $I_{BL[3]}$ of the second clamping transistor NC1, so that a voltage level $V_{QBL}$ of the third output node $QB_L$ is changed to enhance an effective sensing margin. When the bit line current $I_{BL[3]}$ is equal to a parallel resistance current $I_P$, the bit line current $I_{BL[3]}$ of the first left sense-amplifier transistor P0 is different from the reference anti-parallel resistance current $I_{REF\_AP}$ of the first clamping transistor NC0, so that a voltage level $V_{QL}$ of the first output node $Q_L$ is changed to enhance the effective sensing margin. In addition, the variations of voltage levels of the second output node $Q_R$ and the fourth output node $QB_R$ depend on the reference anti-parallel resistance current $I_{REF\_AP}$ of the first right sense-amplifier transistor P2, the bit line current $I_{BL[4]}$ of the third clamping transistor NC2, the bit line current $I_{BL[4]}$ of the second right sense-amplifier transistor P3 and the reference parallel resistance current $I_{REF\_P}$ of the fourth clamping transistor NC3. When the bit line current $I_{BL[4]}$ is equal to the anti-parallel resistance current $I_{AP}$, the bit line current $I_{BL[4]}$ of the second right sense-amplifier transistor P3 is different from the reference parallel resistance current $I_{REF\_P}$ of the fourth clamping transistor NC3, so that a voltage level $V_{QR}$ of the second output node $Q_R$ is changed to enhance the effective sensing margin. When the bit line current $I_{BL[4]}$ is equal to the parallel resistance current $I_P$, the reference anti-parallel resistance current $I_{REF\_AP}$ of the first right sense-amplifier transistor P2 is different from the bit line current $I_{BL[4]}$ of the third clamping transistor NC2, so that a voltage level $V_{QBR}$ of the fourth output node $QB_R$ is changed to enhance the effective sensing margin. Accordingly, the current subtracting operations (SP2) of the sensing method 300 of the present disclosure can enhance the effective sensing margin by about 2 times, compared to a conventional sensing method without the current subtracting operations.

During the core latching time interval (Ph1-SP3) of the sensing time interval in the first part bit line current sensing step S14, a first reference current path ($I_{P4}=I_{REF\_P}$) and a second reference current path ($I_{P5}=I_{REF\_AP}$) are formed, as shown in FIG. 10. The first reference current path ($I_{P4}=I_{REF\_P}$) is formed by the eighth left sense-amplifier transistor P4, the fifth clamping transistor NC4, the ninth left sense-amplifier transistor N8 and the first reference node REF_P. The second reference current path ($I_{P5}=I_{REF\_AP}$) is formed by the eighth right sense-amplifier transistor P5, the sixth clamping transistor NC5, the ninth right sense-amplifier transistor N9 and the second reference node REF_AP. When the voltage level $V_{QL}$ of the first output node $Q_L$ is greater than the voltage level $V_{QBL}$ of the third output node $QB_L$, the first output node $Q_L$ is set to the power supply voltage VDD. When the voltage level $V_{QR}$ of the second output node QR is smaller than the voltage level $V_{QBR}$ of the fourth output node $QB_R$, the second output node $Q_R$ is set to zero. Moreover, a left bit line developing path ($I_{P6}=I_{BL[2]}$) is formed by the tenth left sense-amplifier transistor P6, the seventh clamping transistor NC6, the eleventh left sense-amplifier transistor N10 and the third bit line BL[2]. A right bit line developing path ($I_{P7}=I_{BL[4]}$) is formed by the tenth right sense-amplifier transistor P7, the eighth clamping transistor NC7, the eleventh right sense-amplifier transistor N13 and the sixth bit line BL[5]. Table 1 lists the current sampling operation (SP1) of FIG. 8, the current subtracting operation (SP2) of FIG. 9A and the latching operation (SP3) of FIG. 10. $\Delta V_{QL}$ represents a changed voltage of the first output node $Q_L$. $\Delta V_{QBL}$ represents a changed voltage of the third output node $QB_L$. $\Delta V_{QR}$ represents a changed voltage of the second output node $Q_R$. $\Delta V_{QBR}$ represents a changed voltage of the fourth output node $QB_R$. $T_{SP2}$ represents a time period of the current subtracting operation. $C_{QL}$ represents a capacitance value of the first output node $Q_L$. $C_{QBL}$ represents a capacitance value of the third output node $QB_L$. $C_{QR}$ represents a capacitance value of the second output node $Q_R$. $C_{QBR}$ represents a capacitance value of the fourth output node $QB_R$.

TABLE 1

| Sub-phase | Operation |
| --- | --- |
| SP1 (current sampling operation) | $I_{P0} = I_{BL[3]}$, $I_{P1} = I_{REF\_P}$, $I_{P2} = I_{REF\_AP}$, $I_{P3} = I_{BL[4]}$ |
| SP2 (current subtracting operation) | $I_{P0} = I_{BL[3]}$ (stored in C0), $I_{P1} = I_{REF\_P}$ (stored in C1) $I_{P2} = I_{REF\_AP}$ (stored in C2), $I_{P3} = I_{BL[4]}$ (stored in C3) $\Delta V_{QL} = (T_{SP2} \times (I_{BL[3]} - I_{REF\_AP}))/C_{QL}$ $\Delta V_{QBL} = (T_{SP2} \times (I_{REF\_P} - I_{BL[3]}))/C_{QBL}$ $\Delta V_{QR} = (T_{SP2} \times (I_{BL[4]} - I_{REF\_P}))/C_{QR}$ $\Delta V_{QBR} = (T_{SP2} \times (I_{REF\_AP} - I_{BL[4]}))/C_{QBR}$ |
| SP3 (latching operation) | If $V_{QL} > V_{QBL}$, $Q_L = VDD$, $QB_L = 0$ If $V_{QR} < V_{QBR}$, $Q_R = 0$, $QB_R = VDD$ |

During the branch current sampling time intervals (total of Ph2-SP1, Ph3-SP1 and Ph4-SP1) of the sensing time interval in the second part bit line current sensing step S16, a left branch bit line current path ($I_{P0}$=one of $I_{BL[2]}$, $I_{BL[1]}$, $I_{BL[0]}$), a reference parallel resistance current path ($I_{P1}=I_{REF\_P}$), a reference anti-parallel resistance current path ($I_{P2}=I_{REF\_AP}$) and a right branch bit line current path ($I_{P3}$=one of $I_{BL[5]}$, $I_{BL[6]}$, $I_{BL[7]}$) are formed, as shown in FIG. 11 (only Ph2-SP1). The left branch bit line current path ($I_{P0}$=one of $I_{BL[2]}$, $I_{BL[1]}$, $I_{BL[0]}$) is formed by the first left sense-amplifier transistor P0, the first clamping transistor NC0, one of the twelfth left sense-amplifier transistor N11, the sixteenth left sense-amplifier transistor N17 and the twentieth left sense-amplifier transistor N23, and one of the third bit line BL[2], the second bit line BL[1] and the first bit line BL[0]. The reference parallel resistance current path ($I_{P1}=I_{REF\_P}$) is formed by the second left sense-amplifier transistor P1, the second clamping transistor NC1, the fourth switching transistor N3 and the first reference node REF_P. The reference anti-parallel resistance current path ($I_{P2}=I_{REF\_AP}$) is formed by the first right sense-amplifier transistor P2, the third clamping transistor NC2, the fifth switching transistor N4 and the second reference node REF_AP. The right branch bit line current path ($I_{P3}$=one of $I_{BL[5]}$, $I_{BL[6]}$, $I_{BL[7]}$) is formed by the second right sense-amplifier transistor P3, the fourth clamping transistor NC3, one of the twelfth right sense-amplifier transistor N14, the sixteenth right sense-amplifier transistor N20 and the twentieth right sense-amplifier transistor N26, and one of the sixth bit line BL[5], the seventh bit line BL[6] and the eighth bit line BL[7].

During the branch current subtracting time intervals (total of Ph2-SP2, Ph3-SP2 and Ph4-SP2) of the sensing time interval in the second part bit line current sensing step S16, a first branch current subtracting path ($I_{BL[2]}-I_{REF\_AP}$, $I_{BL[1]}-I_{REF\_AP}$, $I_{BL[0]}-I_{REF\_AP}$), a second branch current subtracting path ($I_{REF\_P}-I_{BL[2]}$, $I_{REF\_P}-I_{BL[1]}$, $I_{REF\_P}-I_{BL[0]}$), a third branch current subtracting path ($I_{REF\_AP}-I_{BL[5]}$, $I_{REF\_AP}-I_{BL[6]}$, $I_{REF\_AP}-I_{BL[7]}$) and a fourth branch current subtracting path ($I_{BL[5]}-I_{REF\_P}$, $I_{BL[6]}-I_{REF\_P}$, $I_{BL[7]}-I_{REF\_P}$) are formed, as shown in FIG. 12 (only Ph2-SP2). The first branch current subtracting path is formed by the first left sense-amplifier transistor P0, the first clamping transistor NC0, the sixth left switching transistor N5 and the second reference node REF_AP. The second branch current subtracting path is formed by the second left sense-amplifier transistor P1, the second clamping transistor NC1, one of the thirteenth left sense-amplifier transistor N12, the seventeenth left sense-amplifier transistor N18 and the twenty-first left sense-amplifier transistor N24, and one of the third bit line BL[2], the second bit line BL[1] and the first bit line BL[0]. The third branch current subtracting path is formed by the first right sense-amplifier transistor P2, the third clamping transistor NC2, and one of the thirteenth right sense-amplifier transistor N15, the seventeenth right sense-amplifier transistor N21 and the twenty-first right sense-amplifier transistor N27, and one of the sixth bit line BL[5], the seventh bit line BL[6] and the eighth bit line BL[7]. The fourth branch current subtracting path is formed by the second right sense-amplifier transistor P3, the fourth clamping transistor NC3, the third switching transistor N2 and the first reference node REF_P. The first left sense-amplifier capacitor C0 of the core sense circuit 200 stores the gate-source voltage of the first left sense-amplifier transistor P0. The second left sense-amplifier capacitor C1 of the core sense circuit 200 stores the gate-source voltage of the second left sense-amplifier transistor P1. The first right sense-amplifier capacitor C2 of the core sense circuit 200 stores the gate-source voltage of the first right sense-amplifier transistor P2. The second right sense-amplifier capacitor C3 of the core sense circuit 200 stores the gate-source voltage of the second right sense-amplifier transistor P3. In addition, the second bit line BL[1] and the seventh bit line BL[6] are precharged to the read voltage $V_{read}$ and then developing by the core sense circuit 212, the second left bit line precharge branch circuit B2_L and the second right bit line precharge branch circuit B2_R.

During the branch latching time intervals (total of Ph2-SP3, Ph3-SP3 and Ph4-SP3) of the sensing time interval in the second part bit line current sensing step S16, a first reference current path ($I_{P4}=I_{REF\_P}$) and a second reference current path ($I_{P5}=I_{REF\_AP}$) are formed, as shown in FIG. 13 (only Ph2-SP3). The first reference current path and the second reference current path of FIG. 13 are the same as the first reference current path and the second reference current path of FIG. 10, respectively. When the voltage level $V_{QL}$ of the first output node $Q_L$ is greater than the voltage level $V_{QBL}$ of the third output node $QB_L$, the first output node $Q_L$ is set to the power supply voltage VDD. When the voltage level $V_{QR}$ of the second output node $Q_R$ is smaller than a voltage level $V_{QBR}$ of a fourth output node $QB_R$, the second output node $Q_R$ is equal to zero.

In FIG. 14, one clock cycle is greater than the sum of the bit line developing time interval Ph0 and the sensing time interval (total of Ph1, Ph2, Ph3 and Ph4). A third current sampling operation of the sensing method 300 is performed by the core sense circuit 212, the second left bit line precharge branch circuit B2_L and the second right bit line precharge branch circuit B2_R during a second one (Ph3-SP1) of the branch current sampling time intervals of the sensing time interval. A fourth current sampling operation of the sensing method 300 is performed by the core sense circuit 212, the third left bit line precharge branch circuit B3_L and the third right bit line precharge branch circuit B3_R during a third one (Ph4-SP1) of the branch current sampling time intervals of the sensing time interval. The third current sampling operation and the fourth current sampling operation are similar to the second current sampling operation of FIG. 11. A third current subtracting operation of the sensing method 300 is performed by the core sense circuit 212, the second left bit line precharge branch circuit B2_L and the second right bit line precharge branch circuit B2_R during a second one (Ph3-SP2) of the branch current subtracting time intervals of the sensing time interval. A fourth current subtracting operation of the sensing method 300 is performed by the core sense circuit 212, the third left bit line precharge branch circuit B3_L and the third right bit line precharge branch circuit B3_R during a third one (Ph4-SP2) of the branch current subtracting time intervals of the sensing time interval. The third current subtracting operation and the fourth current subtracting operation are similar to the second current subtracting operation of FIG. 12. A third latching operation of the sensing method 300 is performed by the core sense circuit 212 during a second one (Ph3-SP3) of the branch latching time intervals of the sensing time interval. A fourth latching operation of the sensing method 300 is performed by the core sense circuit 212 during a third one (Ph4-SP3) of the branch latching time intervals of the sensing time interval. The third latching operation and the fourth latching operation are similar to the second latching operation of FIG. 13.

According to the aforementioned embodiments and examples, the advantages of the present disclosure are described as follows.

1. The multi-bit current sense amplifier with pipeline current sampling of the resistive memory array structure and the sensing method thereof of the present disclosure can apply the read voltage to precharge the bit lines before reading the non-volatile memory array. Because the non-volatile memory array is read by current, it takes a long time to charge the bit-line capacitances on the bit lines to the read voltage until the memory current is stable before reading. The precharging of the present disclosure can shorten the current sampling time of the non-volatile memory cells and achieve shorter read time.

2. The multi-bit current sense amplifier with pipeline current sampling of the resistive memory array structure and the sensing method thereof of the present disclosure can read the non-volatile memory cells by sharing the same core sense circuit and reference currents to achieve higher area efficiency and lower peak current. When the multi-bit current sense amplifier is activated, multiple non-volatile memory cells which need to be read can be switched into the same core sense circuit for reading in a clock cycle, sharing the read circuit and the reference current. Higher area efficiency and lower peak current can be achieved.

3. The multi-bit current sense amplifier with pipeline current sampling of the resistive memory array structure and the sensing method thereof of the present disclosure utilize a pipeline current sampling technology to achieve faster read and reduce the power consumption. In the case of switching the different memory cells into the core sense circuit for reading, the non-volatile memory cells that have not been switched into the core sense circuit can be sampled by the other branches PMOS. The parasitic capacitance of the bit lines is charged to the read voltage, so that there is a faster current settling time when switching into the core sense circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A multi-bit current sense amplifier with pipeline current sampling of a resistive memory array structure, which is configured to sense a plurality of bit line currents of a plurality of bit lines in a pipeline operation, and the multi-bit current sense amplifier with pipeline current sampling of the resistive memory array structure comprising:

a core sense circuit having a first output node and a second output node, wherein the core sense circuit is connected to one part of the bit lines and generates a reference parallel resistance current and a reference anti-parallel resistance current; and a plurality of bit line precharge branch circuits electrically connected to the core sense circuit, wherein the bit line precharge branch circuits are connected to another part of the bit lines;

wherein the bit line currents of the bit lines, the reference parallel resistance current and the reference anti-parallel resistance current are sensed by the core sense circuit and the bit line precharge branch circuits in the pipeline operation so as to sequentially generate a plurality of voltage levels on the first output node and the second output node in a clock cycle.

2. The multi-bit current sense amplifier with pipeline current sampling of the resistive memory array structure of claim 1, wherein the core sense circuit and the bit line precharge branch circuits are operated in a bit line developing time interval and a sensing time interval, the sensing time interval follows the bit line developing time interval, each of the bit lines is precharged to a read voltage before the bit line developing time interval, and the read voltage is smaller than a power supply voltage and greater than a ground voltage.

3. The multi-bit current sense amplifier with pipeline current sampling of the resistive memory array structure of claim 1, wherein the core sense circuit further has a third output node, a first left inner node, a second left inner node and a third left inner node, and the core sense circuit comprises:
- a first left sense-amplifier transistor connected to a power supply voltage, the first output node and the first left inner node;
- a second left sense-amplifier transistor connected to the power supply voltage, the third output node and the second left inner node;
- a third left sense-amplifier transistor connected to the first output node, the third left inner node and the third output node;
- a fourth left sense-amplifier transistor connected to the third output node, the third left inner node and the first output node;
- a fifth left sense-amplifier transistor connected to the third left inner node, a sense amplifier enable signal and a ground voltage;
- a sixth left sense-amplifier transistor connected to the first left inner node, the sense amplifier enable signal and the third output node;
- a seventh left sense-amplifier transistor connected to the second left inner node, the sense amplifier enable signal and the first output node;
- a first left sense-amplifier capacitor connected between the power supply voltage and the first left inner node;
- a second left sense-amplifier capacitor connected between the power supply voltage and the second left inner node;
- a first left sense-amplifier switch connected between the first output node and the first left inner node, wherein the first left sense-amplifier switch is controlled by a switching control signal; and
- a second left sense-amplifier switch connected between the third output node and the second left inner node, wherein the second left sense-amplifier switch is controlled by the switching control signal.

4. The multi-bit current sense amplifier with pipeline current sampling of the resistive memory array structure of claim 3, wherein the core sense circuit further has a fourth output node, a first right inner node, a second right inner node and a third right inner node, and the core sense circuit further comprises:
- a first right sense-amplifier transistor connected to the power supply voltage, the fourth output node and the first right inner node;
- a second right sense-amplifier transistor connected to the power supply voltage, the second output node and the second right inner node;
- a third right sense-amplifier transistor connected to the fourth output node, the third right inner node and the second output node;
- a fourth right sense-amplifier transistor connected to the second output node, the third right inner node and the fourth output node;
- a fifth right sense-amplifier transistor connected to the third right inner node, the sense amplifier enable signal and the ground voltage;
- a sixth right sense-amplifier transistor connected to the first right inner node, the sense amplifier enable signal and the second output node;
- a seventh right sense-amplifier transistor connected to the second right inner node, the sense amplifier enable signal and the fourth output node;
- a first right sense-amplifier capacitor connected between the power supply voltage and the first right inner node;
- a second right sense-amplifier capacitor connected between the power supply voltage and the second right inner node;
- a first right sense-amplifier switch connected between the fourth output node and the first right inner node, wherein the first right sense-amplifier switch is controlled by the switching control signal; and
- a second right sense-amplifier switch connected between the second output node and the second right inner node, wherein the second right sense-amplifier switch is controlled by the switching control signal.

5. The multi-bit current sense amplifier with pipeline current sampling of the resistive memory array structure of claim 4, wherein the core sense circuit further has a fourth left inner node, a fifth left inner node, a fourth right inner node and a fifth right inner node, and the core sense circuit further comprises:
- a first clamping transistor connected to a clamping signal, the first output node and the fourth left inner node;
- a second clamping transistor connected to the clamping signal, the third output node and the fifth left inner node;
- a third clamping transistor connected to the clamping signal, the fourth output node and the fourth right inner node; and
- a fourth clamping transistor connected to the clamping signal, the second output node and the fifth right inner node.

6. The multi-bit current sense amplifier with pipeline current sampling of the resistive memory array structure of claim 5, wherein the core sense circuit further has a first bit line node, a second bit line node, a first reference node and a second reference node, and the core sense circuit further comprises:
- a first left switching transistor connected to the fourth left inner node, the first bit line node and a first switching signal;
- a second switching transistor connected to the fifth left inner node, the first bit line node and a second switching signal;
- a third switching transistor connected to the fifth right inner node, the first reference node and a switch reference signal;
- a fourth switching transistor connected to the fifth left inner node, the first reference node and the switching control signal;
- a fifth switching transistor connected to the fourth right inner node, the second reference node and the switching control signal;
- a sixth left switching transistor connected to the fourth left inner node, the second reference node and the switch reference signal;
- a seventh switching transistor connected to the fourth right inner node, the second bit line node and the second switching signal; and
- an eighth switching transistor connected to the fifth right inner node, the second bit line node and the first switching signal;

wherein the reference parallel resistance current and the reference anti-parallel resistance current flow through the first reference node and the second reference node, respectively.

7. The multi-bit current sense amplifier with pipeline current sampling of the resistive memory array structure of claim 6, wherein the core sense circuit further comprises:
an eighth left sense-amplifier transistor connected to the power supply voltage;
a fifth clamping transistor connected to the eighth left sense-amplifier transistor and the clamping signal;
a ninth left sense-amplifier transistor connected to the fifth clamping transistor, the sense amplifier enable signal and the first reference node;
an eighth right sense-amplifier transistor connected to the power supply voltage;
a sixth clamping transistor connected to the eighth right sense-amplifier transistor and the clamping signal; and
a ninth right sense-amplifier transistor connected to the sixth clamping transistor, the sense amplifier enable signal and the second reference node.

8. The multi-bit current sense amplifier with pipeline current sampling of the resistive memory array structure of claim 6, wherein the bit line precharge branch circuits comprise a first left bit line precharge branch circuit and a first right bit line precharge branch circuit;
the first left bit line precharge branch circuit has a third bit line node and comprises:
a tenth left sense-amplifier transistor connected to the power supply voltage;
a seventh clamping transistor connected to the tenth left sense-amplifier transistor and the clamping signal;
an eleventh left sense-amplifier transistor connected to the seventh clamping transistor, a third switching signal and the third bit line node;
a twelfth left sense-amplifier transistor connected to the fourth left inner node, a fourth switching signal and the third bit line node; and
a thirteenth left sense-amplifier transistor connected to the fifth left inner node, a fifth switching signal and the third bit line node; and
the first right bit line precharge branch circuit has a fourth bit line node and comprises:
a tenth right sense-amplifier transistor connected to the power supply voltage;
an eighth clamping transistor connected to the tenth right sense-amplifier transistor and the clamping signal;
an eleventh right sense-amplifier transistor connected to the eighth clamping transistor, the third switching signal and the fourth bit line node;
a twelfth right sense-amplifier transistor connected to the fifth right inner node, the fourth switching signal and the fourth bit line node; and
a thirteenth right sense-amplifier transistor connected to the fourth right inner node, the fifth switching signal and the fourth bit line node.

9. The multi-bit current sense amplifier with pipeline current sampling of the resistive memory array structure of claim 8, wherein the bit line precharge branch circuits further comprise a second left bit line precharge branch circuit and a second right bit line precharge branch circuit;
the second left bit line precharge branch circuit has a fifth bit line node and comprises:
a fourteenth left sense-amplifier transistor connected to the power supply voltage;
a ninth clamping transistor connected to the fourteenth left sense-amplifier transistor and the clamping signal;
a fifteenth left sense-amplifier transistor connected to the ninth clamping transistor, a sixth switching signal and the fifth bit line node;
a sixteenth left sense-amplifier transistor connected to the fourth left inner node, a seventh switching signal and the fifth bit line node; and
a seventeenth left sense-amplifier transistor connected to the fifth left inner node, an eighth switching signal and the fifth bit line node; and
the second right bit line precharge branch circuit has a sixth bit line node and comprises:
a fourteenth right sense-amplifier transistor connected to the power supply voltage;
a tenth clamping transistor connected to the fourteenth right sense-amplifier transistor and the clamping signal;
a fifteenth right sense-amplifier transistor connected to the tenth clamping transistor, the sixth switching signal and the sixth bit line node;
a sixteenth right sense-amplifier transistor connected to the fifth right inner node, the seventh switching signal and the sixth bit line node; and
a seventeenth right sense-amplifier transistor connected to the fourth right inner node, the eighth switching signal and the sixth bit line node.

10. The multi-bit current sense amplifier with pipeline current sampling of the resistive memory array structure of claim 9, wherein the bit line precharge branch circuits further comprise a third left bit line precharge branch circuit and a third right bit line precharge branch circuit;
the third left bit line precharge branch circuit has a seventh bit line node and comprises:
an eighteenth left sense-amplifier transistor connected to the power supply voltage;
an eleventh clamping transistor connected to the eighteenth left sense-amplifier transistor and the clamping signal;
a nineteenth left sense-amplifier transistor connected to the eleventh clamping transistor, a ninth switching signal and the seventh bit line node;
a twentieth left sense-amplifier transistor connected to the fourth left inner node, a tenth switching signal and the seventh bit line node; and
a twenty-first left sense-amplifier transistor connected to the fifth left inner node, an eleventh switching signal and the seventh bit line node; and
the third right bit line precharge branch circuit has an eighth bit line node and comprises:
an eighteenth right sense-amplifier transistor connected to the power supply voltage;
a twelfth clamping transistor connected to the eighteenth right sense-amplifier transistor and the clamping signal;
a nineteenth right sense-amplifier transistor connected to the twelfth clamping transistor, the ninth switching signal and the eighth bit line node;
a twentieth right sense-amplifier transistor connected to the fifth right inner node, the tenth switching signal and the eighth bit line node; and
a twenty-first right sense-amplifier transistor connected to the fourth right inner node, the eleventh switching signal and the eighth bit line node.

11. The multi-bit current sense amplifier with pipeline current sampling of the resistive memory array structure of claim 10, wherein,
- the bit lines comprise a first bit line, a second bit line, a third bit line, a fourth bit line, a fifth bit line, a sixth bit line, a seventh bit line and an eighth bit line, the one part of the bit lines comprise the fourth bit line and the fifth bit line, and the another part of the bit lines comprise the first bit line, the second bit line, the third bit line, the sixth bit line, the seventh bit line and the eighth bit line;
- the first bit line and the eighth bit line are connected to the seventh bit line node and the eighth bit line node, respectively;
- the second bit line and the seventh bit line are connected to the fifth bit line node and the sixth bit line node, respectively;
- the third bit line and the sixth bit line are connected to the third bit line node and the fourth bit line node, respectively; and
- the fourth bit line and the fifth bit line are connected to the first bit line node and the second bit line node, respectively.

12. A sensing method of the multi-bit current sense amplifier with pipeline current sampling of the resistive memory array structure of claim 1, comprising:
- performing a voltage level applying step to apply a plurality of voltage levels to a plurality of control signals, respectively, wherein the control signals are configured to control the core sense circuit and the bit line precharge branch circuits;
- performing a first part bit line current sensing step to sense the bit line currents of the one part of the bit lines via the core sense circuit according to the voltage levels of the control signals; and
- performing a second part bit line current sensing step to sense the bit line currents of the another part of the bit lines via the core sense circuit and the bit line precharge branch circuits according to the voltage levels of the control signals.

13. The sensing method of claim 12, wherein the first part bit line current sensing step and the second part bit line current sensing step are operated in a bit line developing time interval and a sensing time interval, the sensing time interval follows the bit line developing time interval, each of the bit lines is precharged to a read voltage before the bit line developing time interval, and the read voltage is smaller than a power supply voltage and greater than a ground voltage.

14. The sensing method of claim 13, wherein during the bit line developing time interval and a core current sampling time interval of the sensing time interval in the first part bit line current sensing step,
- a left bit line current path is formed by a first left sense-amplifier transistor, a first clamping transistor, a first left switching transistor and a fourth bit line;
- a reference parallel resistance current path is formed by a second left sense-amplifier transistor, a second clamping transistor, a fourth switching transistor and a first reference node;
- a reference anti-parallel resistance current path is formed by a first right sense-amplifier transistor, a third clamping transistor, a fifth switching transistor and a second reference node; and
- a right bit line current path is formed by a second right sense-amplifier transistor, a fourth clamping transistor, an eighth switching transistor and a fifth bit line.

15. The sensing method of claim 13, wherein during a core current subtracting time interval of the sensing time interval in the first part bit line current sensing step,
- a first left sense-amplifier capacitor of the core sense circuit stores a gate-source voltage of a first left sense-amplifier transistor;
- a second left sense-amplifier capacitor of the core sense circuit stores a gate-source voltage of a second left sense-amplifier transistor;
- a first right sense-amplifier capacitor of the core sense circuit stores a gate-source voltage of a first right sense-amplifier transistor; and
- a second right sense-amplifier capacitor of the core sense circuit stores a gate-source voltage of a second right sense-amplifier transistor.

16. The sensing method of claim 15, wherein during the core current subtracting time interval of the sensing time interval in the first part bit line current sensing step,
- a first current subtracting path is formed by a first left sense-amplifier transistor, a first clamping transistor, a sixth left switching transistor and a second reference node;
- a second current subtracting path is formed by a second left sense-amplifier transistor, a second clamping transistor, a second switching transistor and a fourth bit line;
- a third current subtracting path is formed by a first right sense-amplifier transistor, a third clamping transistor, a seventh switching transistor and a fifth bit line; and
- a fourth current subtracting path is formed by a second right sense-amplifier transistor, a fourth clamping transistor, a third switching transistor and a first reference node.

17. The sensing method of claim 13, wherein during a core latching time interval of the sensing time interval in the first part bit line current sensing step, a first reference current path is formed by an eighth left sense-amplifier transistor, a fifth clamping transistor, a ninth left sense-amplifier transistor and a first reference node;
- a second reference current path is formed by an eighth right sense-amplifier transistor, a sixth clamping transistor, a ninth right sense-amplifier transistor and the second reference node; and
- when the voltage level of the first output node is greater than a voltage level of a third output node, the first output node is set to the power supply voltage, and when the voltage level of the second output node is smaller than a voltage level of a fourth output node, the second output node is set to zero.

18. The sensing method of claim 13, wherein during a plurality of branch current sampling time intervals of the sensing time interval in the second part bit line current sensing step,
- a left branch bit line current path is formed by a first left sense-amplifier transistor, a first clamping transistor, one of a twelfth left sense-amplifier transistor, a sixteenth left sense-amplifier transistor and a twentieth left sense-amplifier transistor, and one of a third bit line, a second bit line and a first bit line;
- a reference parallel resistance current path is formed by a second left sense-amplifier transistor, a second clamping transistor, a fourth switching transistor and a first reference node;
- a reference anti-parallel resistance current path is formed by a first right sense-amplifier transistor, a third clamping transistor, a fifth switching transistor and a second reference node; and a right branch bit line current path is formed by a second right sense-amplifier transistor, a fourth clamping transistor, one of a twelfth right sense-amplifier transistor, a sixteenth right sense-amplifier transistor and a twentieth right sense-amplifier transistor, and one of a sixth bit line, a seventh bit line and an eighth bit line.

19. The sensing method of claim 13, wherein during a plurality of branch current subtracting time intervals of the sensing time interval in the second part bit line current sensing step,

- a first branch current subtracting path is formed by a first left sense-amplifier transistor, a first clamping transistor, a sixth left switching transistor and a second reference node;
- a second branch current subtracting path is formed by a second left sense-amplifier transistor, a second clamping transistor, one of a thirteenth left sense-amplifier transistor, a seventeenth left sense-amplifier transistor and a twenty-first left sense-amplifier transistor, and one of a third bit line, a second bit line and a first bit line;
- a third branch current subtracting path is formed by a first right sense-amplifier transistor, a third clamping transistor, and one of a thirteenth right sense-amplifier transistor, a seventeenth right sense-amplifier transistor and a twenty-first right sense-amplifier transistor, and one of a sixth bit line, a seventh bit line and an eighth bit line;
- a fourth branch current subtracting path is formed by a second right sense-amplifier transistor, a fourth clamping transistor, a third switching transistor and a first reference node;
- a first left sense-amplifier capacitor of the core sense circuit stores a gate-source voltage of a first left sense-amplifier transistor;
- a second left sense-amplifier capacitor of the core sense circuit stores a gate-source voltage of a second left sense-amplifier transistor;
- a first right sense-amplifier capacitor of the core sense circuit stores a gate-source voltage of a first right sense-amplifier transistor; and
- a second right sense-amplifier capacitor of the core sense circuit stores a gate-source voltage of a second right sense-amplifier transistor.

20. The sensing method of claim 13, wherein during a plurality of branch latching time intervals of the sensing time interval in the second part bit line current sensing step,

- a first reference current path is formed by an eighth left sense-amplifier transistor, a fifth clamping transistor, a ninth left sense-amplifier transistor and a first reference node;
- a second reference current path is formed by an eighth right sense-amplifier transistor, a sixth clamping transistor, a ninth right sense-amplifier transistor and the second reference node; and
- when the voltage level of the first output node is greater than a voltage level of a third output node, the first output node is set to the power supply voltage, and when the voltage level of the second output node is smaller than a voltage level of a fourth output node, the second output node is set to zero.

* * * * *